(12) United States Patent
Weeks

(10) Patent No.: US 11,047,921 B2
(45) Date of Patent: Jun. 29, 2021

(54) PROTECTIVE WIRING DEVICE

(71) Applicant: Pass & Seymour, Inc., Syracuse, NY (US)

(72) Inventor: Richard Weeks, Little York, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 75 days.

(21) Appl. No.: 16/392,955

(22) Filed: Apr. 24, 2019

(65) Prior Publication Data

US 2019/0252873 A1 Aug. 15, 2019

Related U.S. Application Data

(63) Continuation of application No. 15/235,548, filed on Aug. 12, 2016, now Pat. No. 10,291,014, which is a
(Continued)

(51) Int. Cl.
| | |
|---|---|
| *H01H 83/04* | (2006.01) |
| *G01R 31/52* | (2020.01) |
| *H02H 3/10* | (2006.01) |
| *G01R 15/18* | (2006.01) |
| *H01H 83/02* | (2006.01) |
| *H01H 83/22* | (2006.01) |
| *H02H 3/00* | (2006.01) |

(Continued)

(52) U.S. Cl.
CPC ............ *G01R 31/52* (2020.01); *G01R 15/18* (2013.01); *H01H 71/025* (2013.01); *H01H 83/02* (2013.01); *H01H 83/04* (2013.01); *H01H 83/226* (2013.01); *H02B 13/00* (2013.01); *H02H 3/00* (2013.01); *H02H 3/06* (2013.01); *H02H 3/105* (2013.01); *H02H 9/04* (2013.01); *H01H 71/0207* (2013.01)

(58) Field of Classification Search
USPC .......................................................... 361/42
See application file for complete search history.

(56) References Cited

U.S. PATENT DOCUMENTS

| | | | | |
|---|---|---|---|---|
| 2010/0052691 A1* | 3/2010 | Fong | ...................... | H02H 3/335 324/424 |
| 2011/0046808 A1* | 2/2011 | Kellis | .................. | H01H 47/002 700/293 |
| 2013/0242440 A1* | 9/2013 | Bonasia | ................... | H02H 3/08 361/49 |

\* cited by examiner

*Primary Examiner* — Danny Nguyen
(74) *Attorney, Agent, or Firm* — Bond Schoeneck & King, PLLC; Frederick Price; George McGuire

(57) ABSTRACT

The present invention is directed to electrical wiring device that includes: a housing including a cover and a back body, the housing further including a plurality of line terminals and a plurality of feed-through load terminals, a plurality of receptacle load terminals substantially aligned with a plurality of receptacle openings; a fault protection circuit disposed inside the housing, having sensing components mounted to one side of a first PCB, the fault protection circuit being configured to provide a fault detection signal in response to detecting at least one type of predetermined fault condition; a circuit interrupter disposed inside the housing, the circuit interrupter being configured to couple the plurality respective terminals in response to a reset stimulus being applied to a reset button, the circuit interrupter being configured to decouple the respective plurality of terminals in a second state when the latching element and a reset pin are decoupled in response to the fault detection signal; and an indication circuit having an indicator to alert the user of device status.

38 Claims, 13 Drawing Sheets

Related U.S. Application Data continuation of application No. 14/277,531, filed on May 14, 2014, now Pat. No. 9,437,386.

(51) Int. Cl.
*H02H 3/06* (2006.01)
*H02H 9/04* (2006.01)
*H02B 13/00* (2006.01)
*H01H 71/02* (2006.01)

PROTECTIVE WIRING DEVICE

CROSS REFERENCE TO RELATED APPLICATION

This application is a continuation of U.S. patent application Ser. No. 15/235,548 filed on Aug. 12, 2016, which is a continuation of U.S. patent application Ser. No. 14/277,531 filed on May 14, 2014, the contents of which are relied upon and incorporated herein by reference in its entirety, and the benefit of priority under 35 U.S.C. § 120 is hereby claimed.

BACKGROUND OF THE INVENTION

1. Field of the Invention

The present invention relates generally to electrical wiring devices, and particularly to protective wiring devices.

2. Technical Background

Electric circuits are installed throughout a structure such that electrical service is readily accessible to people that live or work in that structure. An electric circuit includes electrical wires that interconnect electrical wiring devices that are positioned at various locations throughout a structure. There are a variety of electrical wiring devices available to the consumer including outlet receptacles, light switches, dimmers, ground fault circuit interrupters, arc fault circuit interrupters and the like.

Ground fault circuit interrupters (GFCIs), transient voltage surge suppressors (TVSS), surge protective devices (SPDs) and arc fault circuit interrupters (AFCIs) are examples of electrical protective devices. They are used to protect persons and structures from being harmed by electrical fault conditions. Protective devices are typically equipped with a set of interrupting contacts that are used to break the connection between the line terminals and load terminals when a fault condition is detected.

With respect to current industry trends, designers of protective electrical wiring devices are faced with two conflicting objectives. The first objective is to reduce the size of the wiring device housing in each of its three dimensions because smaller wiring devices are easier to install in standard wall box openings. At the same time, consumers are demanding that protective devices include additional protective capabilities and/or functionality. For example, many GFCIs now include self-test circuitry, arc fault prevention circuits, miswire protection circuits, and various types of indicator circuitry. Moreover, consumers want wiring devices that include protective functions in combination with non-protective functions. In particular, customers want protective devices such as GFCIs, AFCIs, TVSSs, and the like, in combination with one or more electric service devices such as switches, outlet receptacles, various types of sensors, dimmers, night lights, and etc. Briefly stated, customers want more features in a smaller volume.

One consequence of this development is that relatively high voltage components are brought closer to small signal voltage components on a single printed circuit board. As a result, electrical wiring device designers must now confront the effects of "surface-tracking." Surface tracking refers to a failure mode wherein defects and contaminants on, and in, the PCB surface form an undesirable circuit path that causes electricity and electrical signals to flow where they are not wanted. When electricity is allowed to track across the surface of a PCB, low voltage circuits may become short circuited and fail. In addition, if unwanted electrical currents cause a device to over-heat, a fire could result.

Referring back to the customer's desire for more features and functionality, many protective devices are now being equipped with microprocessors to meet the aforementioned needs. As a result, the high circuit density noted above may result in AC voltage circuits being disposed next to, or proximate, a processor or other such low voltage circuits. Accordingly, these delicate low voltage signal circuits may be subject to surface-tracking, cross-talk and/or voltage surges. A 6 kV lightning surge, for example, could easily destroy a microprocessor or GFI detector chip.

Another phenomenon that can impact the performance of small signal devices is cross talk. Cross-talk refers to capacitive or electro-magnetic coupling, and may also be the result of stray RF signals or from surface-tracking noise. Cross-talk can be an issue because it may affect the calibration of sensitive electrical circuits. GFCI detectors, e.g., are calibrated to trip when a ground fault leakage current is 6 mA or greater. It is imperative that the detector can obtain a true reading on fault current readings because ground faults can result in human fatalities. With respect to the calibration issue, one must keep in mind that a typical GFI sensor signal is approximately six millionths (0.000006 A) of an Ampere. (A toroidal sensor usually provides the signal input to a GFCI detector). One can see, therefore, how large voltage noise signals can make small signal detections problematic.

Various approaches have been tried to reduce the effects of cross-talk and/or surface-tracking. In one approach, the printed circuit board and all of the circuitry thereon are conformally coated. However, this is a costly manufacturing process and it is subject to manufacturing variabilities. Another approach that has been considered relates to the addition of notches in the PCB. The notches are positioned to isolate the low voltage circuitry from the high voltage circuitry. While this approach can be effective, it also has drawbacks. For example, a relatively large amount of PCB surface area must be devoted to the notches, and as a result, the amount of available surface area for the electronic components can be significantly reduced.

Another issue that is related to device reliability is heat-rise. Devices must operate below a certain temperature or fire may result. One of the main causes of heat-rise are the thermal losses ($I^2R$) caused by resistive interconnections in the AC current path. In other words, the electrical current propagating in the electrical circuit is converted into thermal energy (heat). When a device is packed with a large number of components, it is very practical, from an assembly standpoint, to create a conductive path by interconnecting a number of conductive segments. For example, the practice of routing and interconnecting (hot and neutral) wires through the toroidal assembly results in four interconnections, and four sources of heat-rise.

What is needed therefore is a means for substantially mitigating or obviating the effects of surface tracking, cross-talk and voltage surges without using additional PCB surface area. What is further needed is an effective way to increase the density of electronic components on a PCB while maintaining device reliability. In doing so, it is desirable to limit the number of conductive segments that comprise the AC conductive path from line to load.

SUMMARY OF THE INVENTION

The present invention addresses the needs described above by providing a protective device that substantially obviates the threat of surface tracking and cross-talk from high voltage components to signal voltage components while, at the same time, reducing the PCB surface area. Moreover, the present invention allows for an increase in the density of electronic components on a protective device PCB while maintaining device reliability. The present invention is also configured to substantially prevent voltage surges propagating in the AC electrical distribution system from damaging small signal components. In accomplishing the above stated objectives, the present invention also limits the number of conductive segments that comprise the AC conductive path from line to load to thus limit heat rise.

Generally in one aspect, an electrical wiring device includes: a housing assembly including a cover assembly and a back body member, the cover assembly including a front cover having a plurality of receptacle openings, the housing assembly further including a plurality of line terminals and a plurality of feed-through load terminals, the housing assembly also including a plurality of receptacle load terminals substantially aligned with the plurality of receptacle openings; a separator portion disposed between the back body member and the cover assembly, the separator portion including a reset pin aperture accessible via a first major surface facing the front cover and a reset pin guide portion disposed on an opposite second major surface facing the back body member both being configured to accommodate a reset pin; and a latch block assembly including a central latch block portion configured to accommodate the reset pin and a latching element, the central latch block portion including an open side configured to accommodate the reset pin guide portion, the reset pin being substantially prevented by the reset pin guide portion from exiting the central latch block portion via the open side.

According to an embodiment, the latching element is configured to move the reset pin toward the reset pin guide portion when force is applied thereto.

According to an embodiment, the device further includes a fault protection circuit disposed in the back body and substantially disposed on at least one printed circuit board (PCB), the fault protection circuit being configured to provide a fault detection stimulus in response to detecting at least one type of predetermined fault condition.

According to an embodiment, the device further includes a circuit interrupter disposed inside the housing, the circuit interrupter including the latch block assembly moveable between a first state and a second state, the circuit interrupter being configured to place the plurality of line terminals, the plurality of feed-through load terminals and the plurality of receptacle load terminals in the first state in response to a reset stimulus and place the plurality of line terminals, the plurality of feed-through load terminals and the plurality of receptacle load terminals in the second state in response to a fault detection stimulus, the plurality of receptacle load terminals being connected to the plurality of line terminals and the plurality of feed-through load terminals in the first state and the plurality of receptacle load terminals being electrically isolated from the plurality of line terminals and the plurality of feed-through load terminals in the second state.

According to an embodiment, the circuit interrupter includes a solenoid assembly comprising a solenoid coil and an armature responsive to the fault detection stimulus, the armature being configured to decouple the latching element from the reset pin.

According to an embodiment, the armature moves the latching element toward the reset pin guide portion in response to the fault detection stimulus.

According to an embodiment, the reset pin guide portion is positioned to restrict movement of the reset pin when the circuit interrupter is transitioning from the first state to the second state.

According to an embodiment, the circuit interrupter further includes a plurality of contact sets configured to be closed in the first state and open in the second state, at least one contact set of the plurality of contact sets being configured to decouple at least a portion of the fault protection circuit assembly from a line terminal of the plurality of line terminals, in the second state.

According to an embodiment, the contact set includes a moveable contact and a fixed contact, the moveable contact being disposed on a cantilever member.

Generally in another aspect, an electrical wiring device includes: a housing assembly including a cover assembly and a back body member, the cover assembly including a front cover having a plurality of receptacle openings, the housing assembly further including a plurality of line terminals and a plurality of feed-through load terminals, the housing assembly also including a plurality of receptacle load terminals substantially aligned with the plurality of receptacle openings; a reset assembly including a reset button at least partially disposed in the cover assembly and a reset pin; a separator portion disposed between the back body member and the cover assembly, the separator portion including a reset pin aperture accessible via a first major surface facing the front cover and a reset pin guide portion disposed on an opposite second major surface facing the back body member configured to accommodate the reset pin; a latch block assembly including a central latch block portion configured to accommodate the reset pin and a latching element, the central latch block portion including an open side configured to accommodate the reset pin guide portion, the reset pin guide portion substantially preventing the reset pin from exiting the central latch block portion via the opening; a fault protection circuit disposed inside the housing, the fault protection circuit being configured to provide a fault detection signal in response to detecting at least one type of predetermined fault condition; and a circuit interrupter disposed inside the housing, the circuit interrupter being configured to couple the plurality of line terminals, the plurality of feed-through load terminals and the plurality of receptacle load terminals in a first state in response to a reset stimulus being applied to the reset button, the circuit interrupter being configured to decouple the plurality of line terminals, the plurality of feed-through load terminals and the plurality of receptacle load terminals in a second state when the latching element and the reset pin are decoupled in response to the fault detection signal.

According to an embodiment, the circuit interrupter includes a solenoid assembly comprising a solenoid coil and an armature responsive to the fault detection signal, the armature being configured to decouple the latching element from the reset pin when the at least one type of fault condition is detected.

According to an embodiment, the armature moves the latching element toward the reset pin guide portion in response to the fault detection stimulus.

According to an embodiment, the reset pin guide portion is positioned to restrict movement of the reset pin when the circuit interrupter is transitioning from the first state to the second state.

According to an embodiment, the circuit interrupter further includes a plurality of contact sets configured to be closed in the first state and open in the second state, at least one contact set of the plurality of contact sets being configured to decouple at least a portion of the fault protection circuit assembly from a line terminal of the plurality of line terminals, in the second state.

According to an embodiment, the contact set includes a moveable contact and a fixed contact, the moveable contact being disposed on a cantilever member.

According to an embodiment, the circuit interrupter includes a solenoid assembly that affects the second state in response to the fault detection signal.

According to an embodiment, the circuit interrupter comprises a plurality of moveable bus bars connected to the plurality of feed-through load terminals, a pair of electrical contacts being disposed on each of the moveable bus bars.

According to an embodiment, the latch block assembly is configured to drive the plurality of moveable bus bars to the first state.

According to an embodiment, the at least one type of predetermined fault condition is a ground fault, grounded neutral fault, arc fault, end of life fault, or auto-test fault.

Generally in a further aspect, an electrical wiring device includes: a housing assembly including a cover assembly and a back body member, the cover assembly including a front cover having a plurality of receptacle openings and a separator portion at least partially disposed between the back body member and the front cover, the housing assembly further including a plurality of line terminals and a plurality of feed-through load terminals, the housing assembly also including a plurality of receptacle load terminals substantially aligned with the plurality of receptacle openings; a reset assembly including a reset button at least partially disposed in the front cover and a reset pin, the cover assembly including a reset pin aperture accessible via the front cover and a reset assembly guide portion; a latch block assembly including a central latch block portion configured to accommodate the reset pin and a latching element, the central latch block portion including an opening, the reset assembly guide portion substantially preventing the reset pin from escaping the central latch block portion via the opening; a fault protection circuit disposed inside the housing, the fault protection circuit being configured to provide a fault detection signal in response to detecting at least one type of predetermined fault condition; and a circuit interrupter disposed inside the housing, the circuit interrupter being configured to couple the plurality of line terminals, the plurality of feed-through load terminals and the plurality of receptacle load terminals in a first state in response to a reset stimulus being applied to the reset button, the circuit interrupter being configured to decouple the plurality of line terminals, the plurality of feed-through load terminals and the plurality of receptacle load terminals in a second state when the latching element and the reset pin are decoupled in response to the fault detection signal.

According to an embodiment, the reset assembly guide portion is disposed on a major surface of the separator portion facing the back body member and is configured to accommodate the opening of the latch block assembly.

Generally in another aspect, an electrical wiring device includes: a housing assembly including a cover assembly and a back body member, the cover assembly including a front cover and a separator portion, the front cover having a plurality of receptacle openings and at least one interface button opening, the cover assembly further including a reset pin aperture and a reset guide portion, the housing assembly further including a plurality of line terminals and a plurality of feed-through load terminals, the housing assembly also including a plurality of receptacle load terminals substantially aligned with the plurality of receptacle openings; a latch block assembly including a central latch block portion configured to accommodate a reset pin and a latching element, the central latch block portion including an opening, the reset assembly guide portion substantially preventing the reset pin from escaping the central latch block portion via the opening; a fault protection circuit disposed inside the housing, the fault protection circuit being configured to provide a fault detection signal in response to detecting at least one type of predetermined fault condition; and a circuit interrupter disposed inside the housing, the circuit interrupter being configured to couple the plurality of line terminals, the plurality of feed-through load terminals and the plurality of receptacle load terminals in a first state in response to a reset stimulus being applied to the reset button, the circuit interrupter being configured to decouple the plurality of line terminals, the plurality of feed-through load terminals and the plurality of receptacle load terminals in a second state when the latching element and the reset pin are decoupled in response to the fault detection signal.

According to an embodiment, the at least one interface button opening is configured to accommodate a reset button, the reset button being attached to the reset pin.

According to an embodiment, the reset assembly guide portion is disposed on a major surface of the separator portion facing the back body member and is configured to accommodate the opening of the latch block assembly.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Figures 1A, 1B:
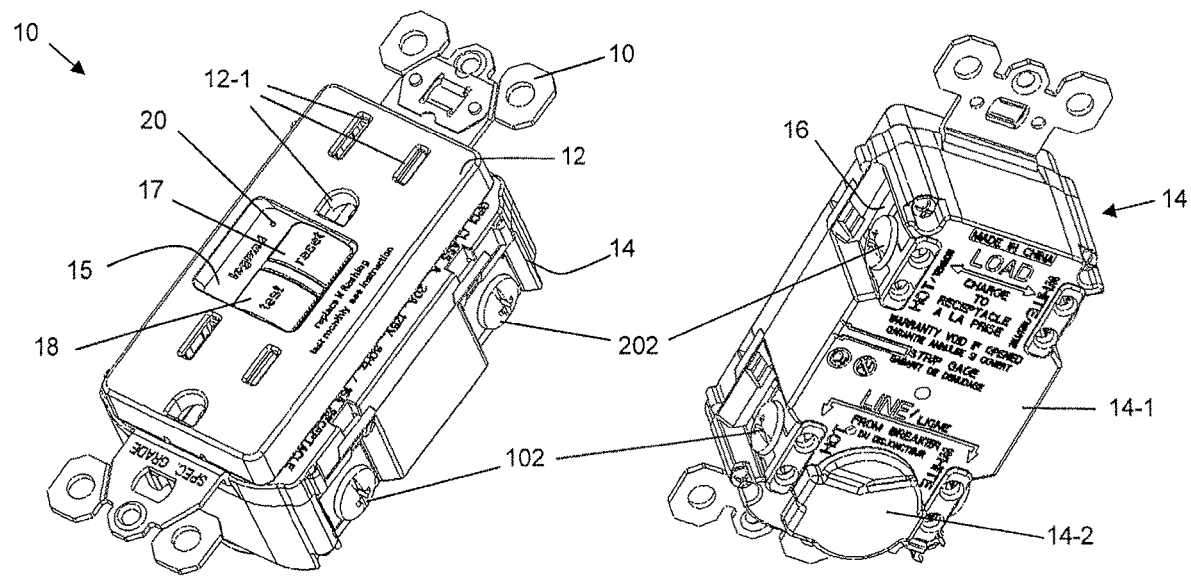
FIGS. 1A-1C are perspective views of the protective electrical wiring device in accordance with various embodiments of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the protective device of the present invention is shown in FIGS. 1A-1C, and is designated generally throughout by reference numeral 10.

Figure 1C:
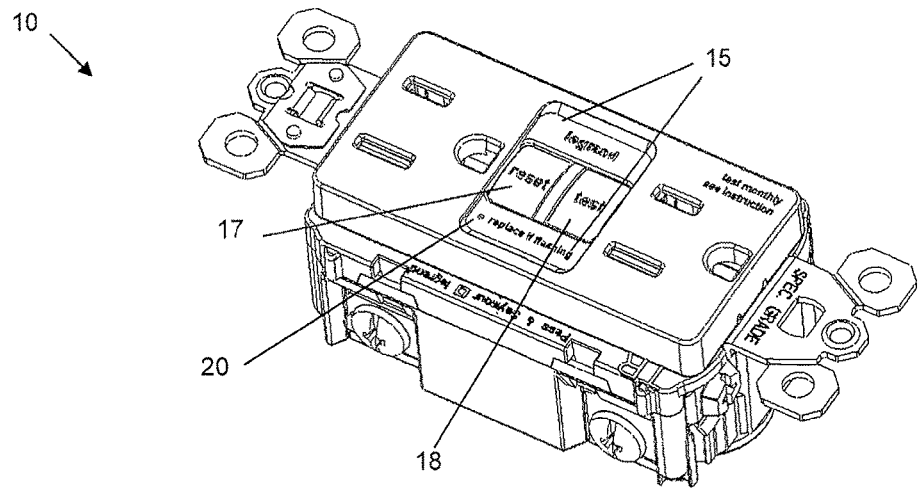

As embodied herein, and depicted in FIGS. 1A-1C, perspective views of the protective electrical wiring device in accordance with various embodiments of the present invention are disclosed. The protective device 10 includes a housing having a front cover 12, a back body member 14 and a separator 16. In these embodiments, only a small portion of the separator 16 can be viewed from the exterior of the device 10 (See, FIG. 1B). The front cover includes outlet receptacles 12-1 which are configured to accept the hot, neutral and ground blades of a corded plug. The back body portion 14 includes line screw terminals 102 and load screw terminals 202 that allow the device to be connected to a source of AC power and a load circuit, respectively. FIG. 1B shows the back body portion 14. The rear major surface 14-1 of the back body includes a raised cylindrically shaped portion 14-2 that is configured to accommodate the toroidal sensor assembly described herein.

As shown herein, the present invention provides the user with various kinds of indicators. FIG. 1A, e.g., shows an asymmetric recessed portion in the front cover that includes a recessed planar surface 15 that can accommodate human-readable indicia and one or more indicator lights 20. The indicator lights may be configured as a trip indicator, a pilot light, a miswire indicator or an end-of-life indicator. The human-readable indicia, therefore, may provide a message or an instruction appropriate for the light(s). For example, if the light is a trip indicator, the message may read "press reset button if illuminated." A reset button 17 and a test button 18 are disposed adjacent to the recessed planar region 15.

In FIG. 1C, the recessed region features a symmetric design with recessed planar surfaces 15 disposed on either side of the test button 18 and reset button 17. The embodiment of FIG. 1C shows an end-of-life indicator light 20 with the message "replace if flashing" adjacent thereto.

Figure 2:
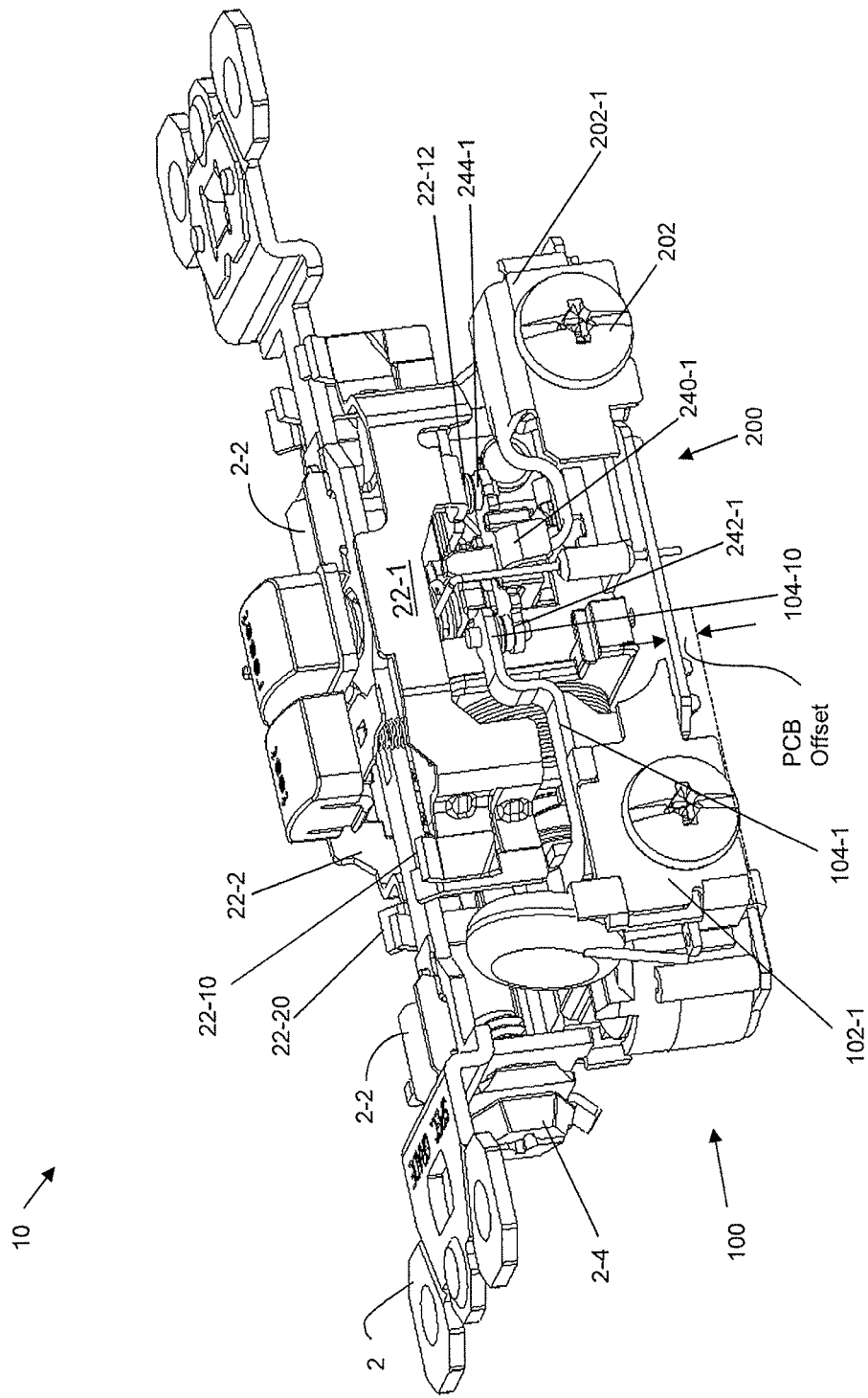
FIG. 2 is a side elevation view of the protective electrical wiring device depicted in FIGS. 1A-1C.

Referring to FIG. 2, a side elevation view of the protective electrical wiring device 10 is disclosed with the front cover, separator and back body removed or not shown. A hot receptacle terminal 22-1 is disposed between the front cover 12 and the separator 16. (Neither the front cover nor the separator are shown in this view for clarity of illustration). The hot receptacle terminal 22-1 includes hot outlet receptacle contacts 22-10, and the neutral receptacle terminal 22-2 includes neutral outlet receptacle contacts 22-20. The ground strap 2 includes ground contacts 2-2. Altogether, these contacts form two sets of contacts (2-2, 22-10 and 22-20) that accommodate the blades of a corded plug via apertures 12-1 formed in the front cover 12. The hot receptacle terminal 22-1 also includes hot fixed contact 22-12 that is configured to mate with the load-side contact 244-1 of the hot bus bar 240-1. The line-side contact 242-1 of the hot bus bar 240-1 mates with the hot contact 104-10 of the line contact arm 104-1.

Turning now to other elements that are disposed below the separator 16 (not shown in this view for clarity of illustration), device 10 is implemented using a line input interface assembly 100 and an electro-mechanical assembly 200. Assembly 100 includes a printed circuit board 101 and the assembly 200 includes another PCB 201 that is offset from the line interface PCB 101. The "PCB Offset" is approximately equal to about 0.25 inches and is configured to prevent cross-talk or surface-tracking propagating in the line input interface PCB 101 to transfer to the electro-mechanical PCB 201.

As described herein, the line input interface assembly 100 provides device 10 with an interface to the line side of the electrical distribution circuit (i.e., to the AC power source). The line input interface assembly 100 may therefore include surge protection, filtering, AC/DC conversion (i.e., power supply circuitry) and other conditioning circuitry. The toroidal sensors, which are electrically connected to circuits on the electromechanical PCB 201, are mounted on the line input interface assembly PCB 101 such that the line hot and line neutral conductors, along with an optional automatic test conductor, can be routed through the central aperture of the toroids.

The electromechanical PCB 201 includes small signal voltage processing components such as the GFI detector, the microprocessor, etc. The solenoid bobbin assembly 210 and latch block 220 are also mechanically mounted to PCB 201. The solenoid bobbin assembly 210 includes at least one solenoid coil 212 having at least one interconnect pin electrically connected to the line hot conductor. Although the solenoid coil is mechanically attached to PCB 201 as part of bobbin assembly 210, the pin has little or no electrical connectivity to PCB 201. Instead, the pin passes through a clearance hole in PCB 201 for electrical connection to the interface PCB 101. The bobbin assembly may be configured to isolate the pin from the low voltage circuitry with a wall of plastic. Load terminals 202 are likewise mounted to electromechanical PCB 201 but with little or no electrical connectivity to the board.

Figure 3:
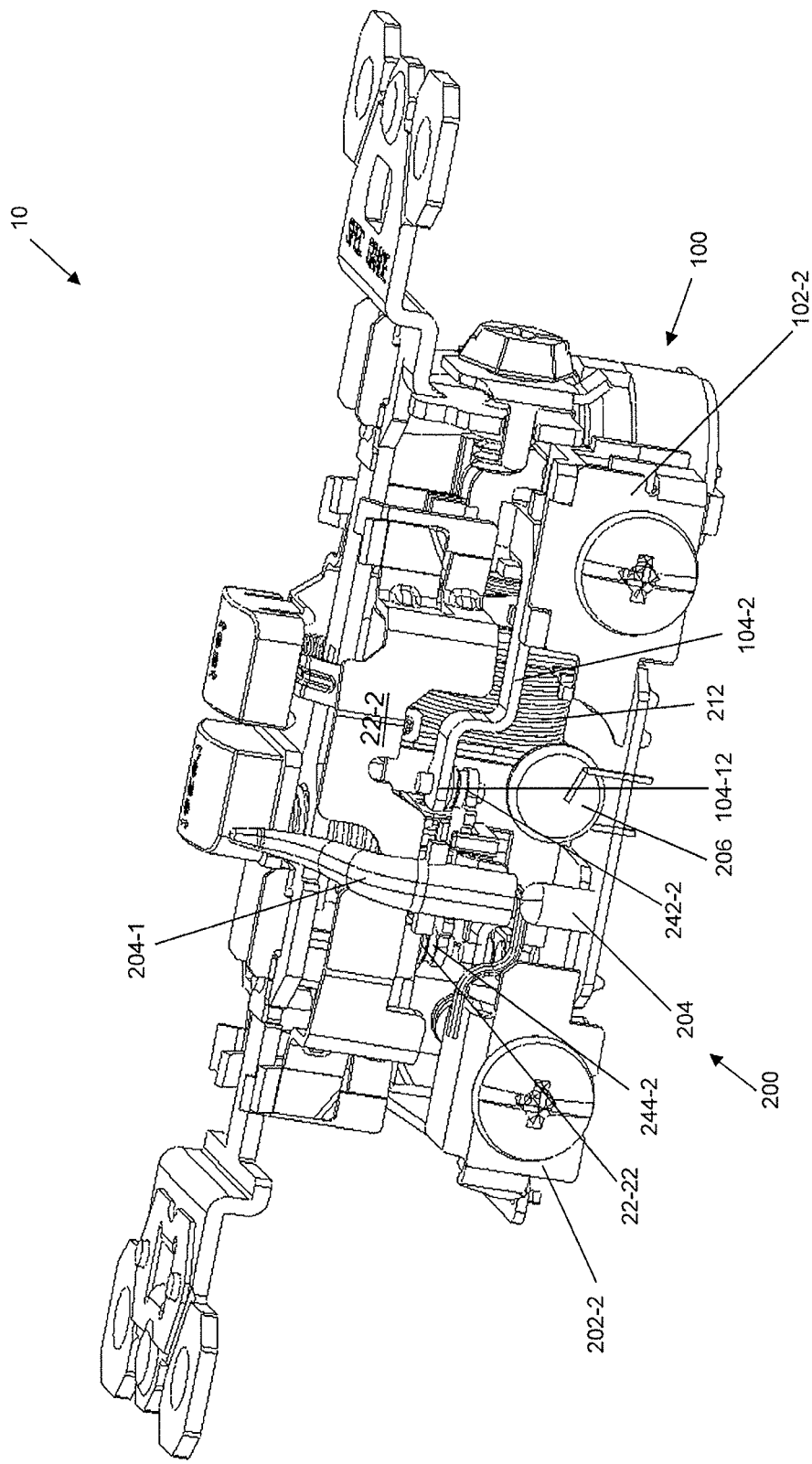
FIG. 3 is a side elevation view of the protective electrical wiring device depicted in FIGS. 1A-1C.

Referring to FIG. 3, the side elevation view of the protective electrical wiring device from the opposite side is shown. This view shows the neutral receptacle terminal 22-2 which includes a neutral fixed contact 22-22 that is configured to mate with a load-side contact 244-2 of the neutral bus bar 240-2 (behind light pipe 204-1). The line-side contact 242-2 of the neutral bus bar 240-2 mates with the neutral contact 104-12 of the line neutral contact arm 104-2. Note that the electro-mechanical assembly 200 also includes MOV 206. MOV 206 is part of a signal conditioning circuit 254 (See, FIG. 14) that also includes an RLC circuit that further protects the solenoid during surge conditions. The inductor portion of this circuit may be implemented using the solenoid coil 212. In an alternate embodiment of the present invention the resistor, capacitor and MOV 206 may be disposed on the interface PCB 101 (See, FIG. 14).

Figure 4:
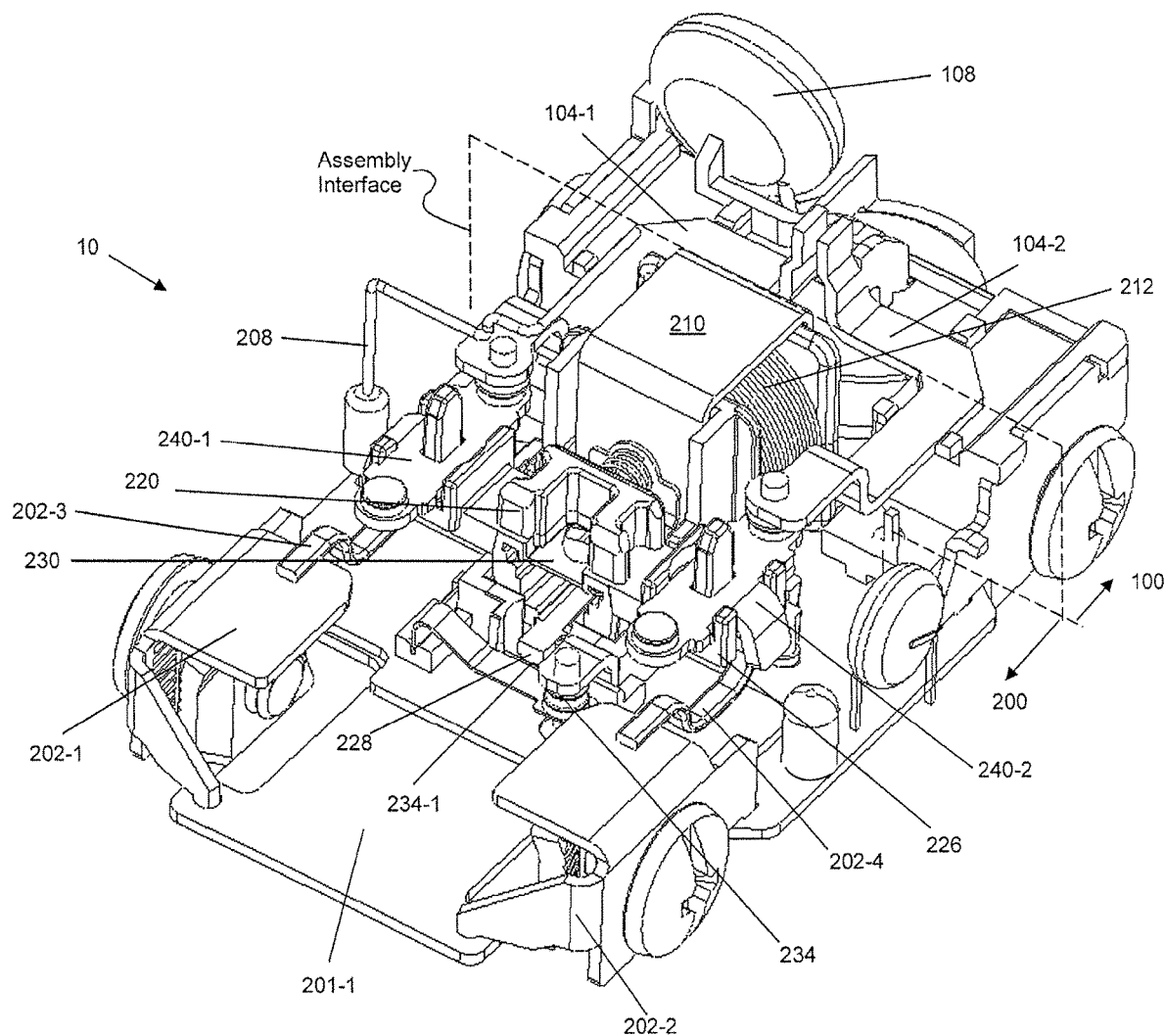
FIG. 4 is a perspective view of the protective electrical wiring device depicted in FIGS. 1A-1C with various components removed.

As embodied herein and depicted in FIG. 4, a perspective view of the protective electrical wiring device 10 is shown with the front cover, separator, back body and face receptacle terminals removed. This view shows an "assembly interface" rectangle—in dashed lines—to show where the interface between the line interface assembly 100 and the electromechanical assembly 200 is located. The interface PCB 101 (not shown in this view) and the electromechanical PCB 201 are interconnected by the line terminals downstream of the line conditioning components to provide a conditioned line hot signal for the power supply 270 and a line neutral signal that functions as a local ground reference for the PCB 201. (See, e.g., FIG. 14).

The solenoid bobbin assembly 210 abuts the interface assembly 100 and is flanked on each side by the line contact arms (104-1, 104-2) that extend from the line interface assembly 100. The line contact arms (104-1, 104-2) include contacts that mate with the line side of the bus bars 240-1 and 240-2, respectively. In turn, each bus bar (240-1, 240-2) is connected to its respective load terminal (202-1, 202-2) by a flex cable (202-3, 202-4), respectively. The bus bars (240-1, 240-2) are configured to move between the reset state and the tripped state by operation of the latch 230 and motion of the latch block 220. The latch block 220 includes an auxiliary switch actuator 228 that is configured to operate the auxiliary switch contacts 234. The region between the load terminals (202-1, 202-2) includes a portion 201-1 of the PCB 201 for small signal components. The microprocessor 252 is disposed on the underside of PCB section 2011 (and thus is not visible in this view). (See, FIG. 14).

Figure 5A:
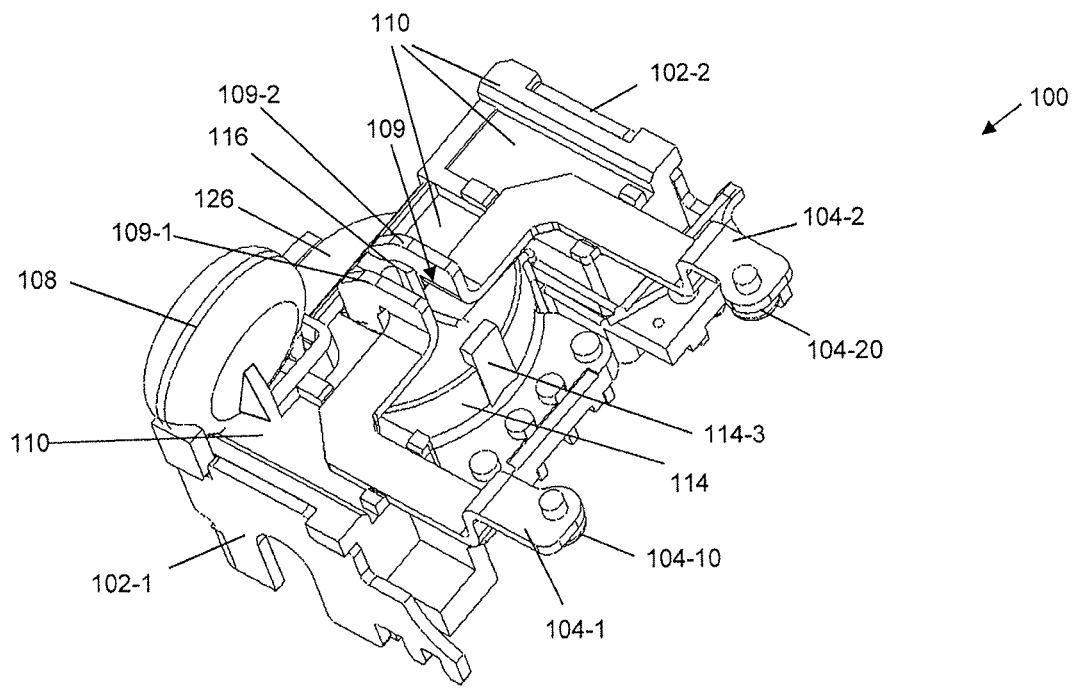
FIGS. 5A-5B are perspective views of the line interface assembly depicted in FIG. 4.
Figure 5B:
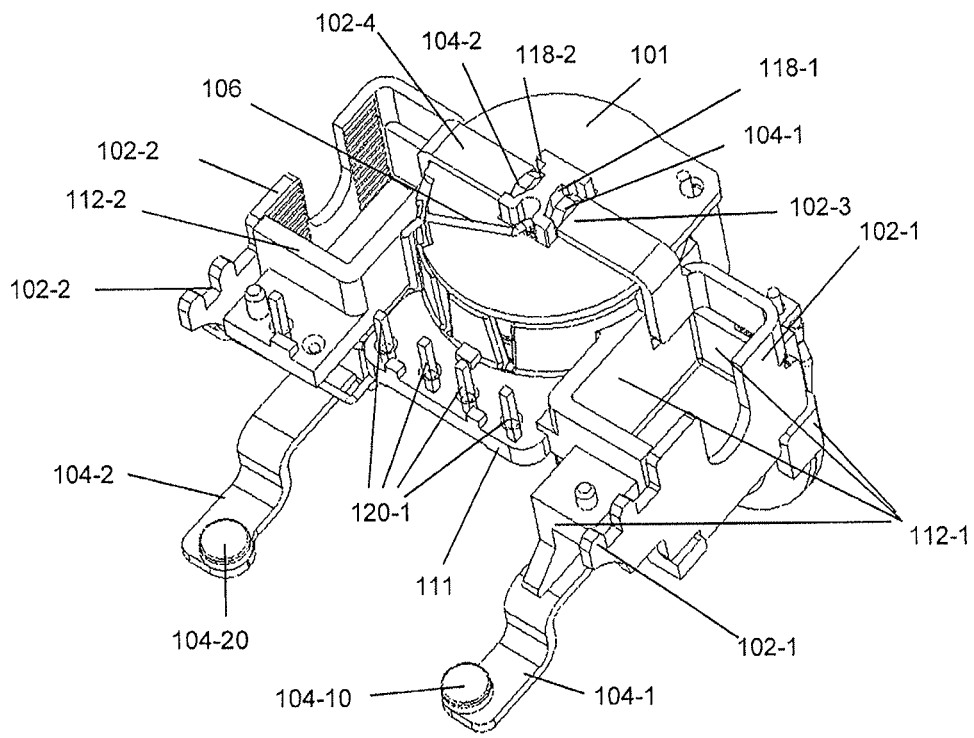

Referring to FIGS. 5A-5B, perspective views of the line interface assembly 100 are disclosed. FIG. 5A shows the top side of the line interface assembly 100. The line interface assembly 100 includes a dielectric, or electrically insulative, housing 110 that has a central cylindrical portion 114. The central cylindrical portion 114 includes a guide channel 116 that is mounted in the PCB 101 such that it follows the central cylindrical axis of the center cylindrical portion 114 from base to base. The central cylindrical portion 114 houses (and substantially shields) the toroidal sensor assembly 120 (See FIG. 6). The guide channel 116 includes three passages (116-1, 1162, and 116-3) that accommodate the hot contact arm 104-1, the neutral contact arm 1042, and a test circuit conductor 106, respectively. See also, FIGS. 7A-7B. As shown in FIG. 5A, the contact arms 104-1 and 104-2 include contacts 104-10 and 104-20, respectively, which form the line portion of the interrupting contact set described below. Furthermore, contact arms 104-1 and 104-2 include portions (109-1, 109-2) respectively that are not electrically isolated by guide channel 116 and spaced apart by a predetermined distance to form the spark gap 109. Spark gap 109 protects MOV 108 when there abnormally high energy lightning surges are present. The spark gap 109, therefore, represents another line voltage conditioning element disposed within the interface assembly 100.

FIG. 5B shows the underside of the line interface assembly 100. This side of cylindrical portion 114 fits within the raised cylindrically shaped portion 14-2 of the back body member 14 shown in FIG. 1B. The guide channel 116 includes a conductor interface portion 118 that extends through the PCB 101. The contact arms 104-1 and 104-2 emerge from the guide channel passages (116-1, 116-2) into the conductor interface element 118 to mate with terminal tabs 102-3 and 102-4, respectively. Note that the screw terminals 102-1 and 102-2 substantially conform to terminal support wing portions (112-1, 112-2) which are integrally connected to the cylindrical portion 114. In particular, the line hot screw terminal 102-1 wraps around support portion 1121 and the line neutral screw terminal 102-1 wraps around support portion 112-2 such that a line hot tab 102-3 and a line neutral tab 102-4, respectively, are positioned within the conductor interface element 118 abutting the end portions of the hot contact arm 104-1 and neutral contact arm 104-2, respectively. At this point, the line hot tab 102-3 is electrically joined to the hot contact arm 104-1, and the line neutral tab 102-4 is electrically joined to the neutral contact arm 104-2. Accordingly, there is a single electro-mechanical interconnection between the path that extends from line hot screw terminal 102-1 to the line hot contact 104-10 and a single electro-mechanical interconnection path from line neutral screw terminal 102-2 to the line neutral contact 104-20. Thus, $I^2R$ losses (electricity converted to heat) are substantially reduced in the conductive paths between the line screw terminals and the line contacts of the circuit interrupter.

Note that the test conductor 106 also emerges from the interface element 118 and is routed to the electro-mechanical assembly 200 where it is connected to an output of the processor 252. Low voltage signal leads 120-1 from the sensors also emerge from a low voltage interface portion 111 of the interface housing 110 and are likewise routed to the electro-mechanical assembly 200 as inputs to the fault detector. See, FIG. 14. Thus, while the toroidal sensor 120 is mechanically mounted to the PCB 101, the low voltage signal leads from the toroidal sensor are electrically connected to the electro-mechanical PCB 201. In other words, the toroidal sensor 120 is disposed and substantially shielded from noise by the dielectric housing 114, which electrically connects it to the second PCB 201 without introducing noise or cross-talk.

Line tabs (102-3, 102-4) are secured to the first PCB 101 using suitable means. A large MOV 108, e.g., 12 mm, is connected between the line hot terminal 102-1 and the line neutral terminal 102-2 in order to condition the AC power input signal provided by a source of AC power. The first PCB 101 may also be configured to include a half-wave rectifier power supply. In another embodiment of the present invention, the PCB 101 is configured to extend a greater distance under the cylindrical portion 114 and the terminal support wings 112-1, 112-2 to provide a larger surface area. In this embodiment, the PCB 101 is configured to accommodate a full-wave bridge rectifier circuit as well as noise mitigating RC filter circuits. In yet another embodiment, the PCB 101 is extended under the PCB 201 to accommodate additional circuitry. See, FIG. 13.

Figure 6:
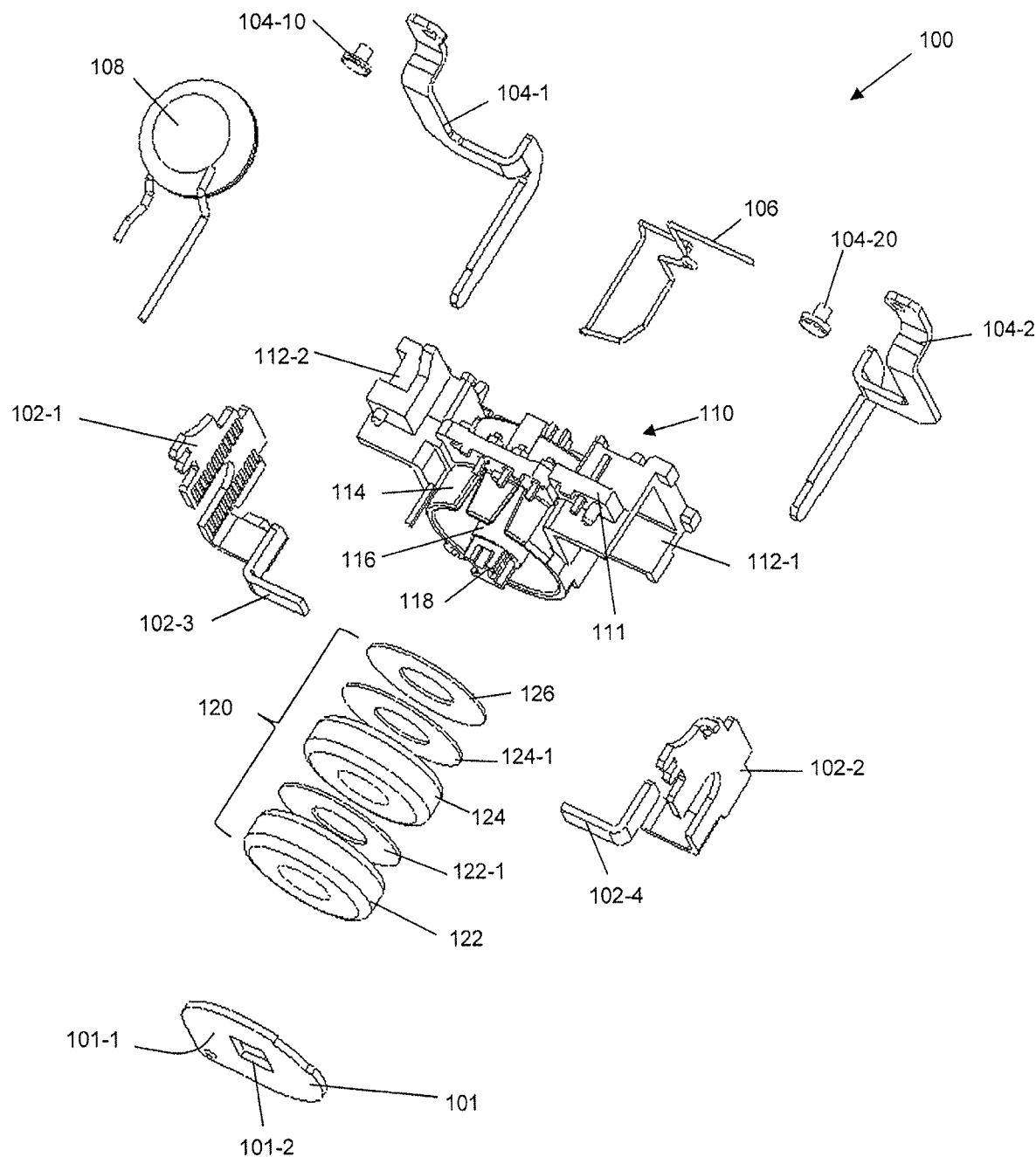
FIG. 6 is an exploded view of the line interface assembly depicted in FIGS. 5A-5B.

Referring to FIG. 6, an exploded view of the line interface assembly 100 depicted in FIGS. 5A-5B is disclosed. The dielectric housing 110 is clearly shown to include the central cylindrical portion 114 and the guide channel 116 disposed along the cylinder's central axis. The interface 118 described above is shown at one end of the guide channel 116. The interface 118 aligns the line terminals 102 with the contact arms 104 such that the line terminals abut respective contact arms. In a subsequent process step, each line terminal/contact arm pair is electromechanically connected using suitable means such (e.g., soldering, etc.). The interface 118 is also configured to be inserted into an opening 101-2 formed in PCB 101. Finally, the offset between the printed circuit board 101 and the PCB 201 is substantially established by the low voltage interface apron 111 and the bottom of the cylindrical housing 114.

The toroidal assembly 120 is inserted into the cylindrical housing 114 and includes a grounded neutral sensor 122, an insulator 122-1, a differential sensor 124, another insulator 124-1, and a shield portion 126. After the toroid assembly 120 is inserted in cylindrical housing 114, the interface portion 118 is inserted into PCB opening 101-2 and the assembly 110/120 assembly is mechanically mounted to the PCB 101.

Figure 7A:
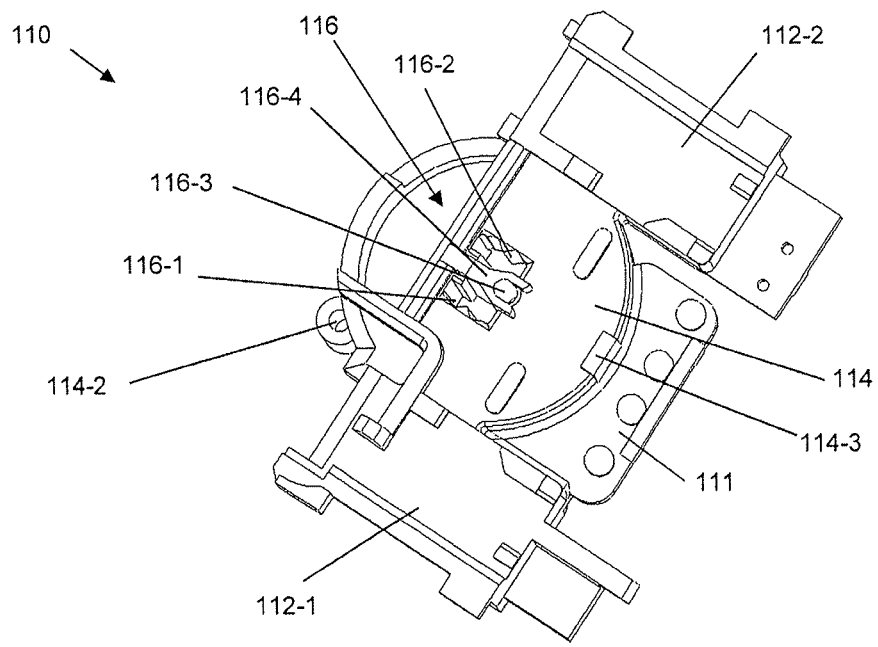
FIGS. 7A-7B are detail perspective views of line interface assembly housing depicted in FIGS. 5A, 5B and 6.
Figure 7B:
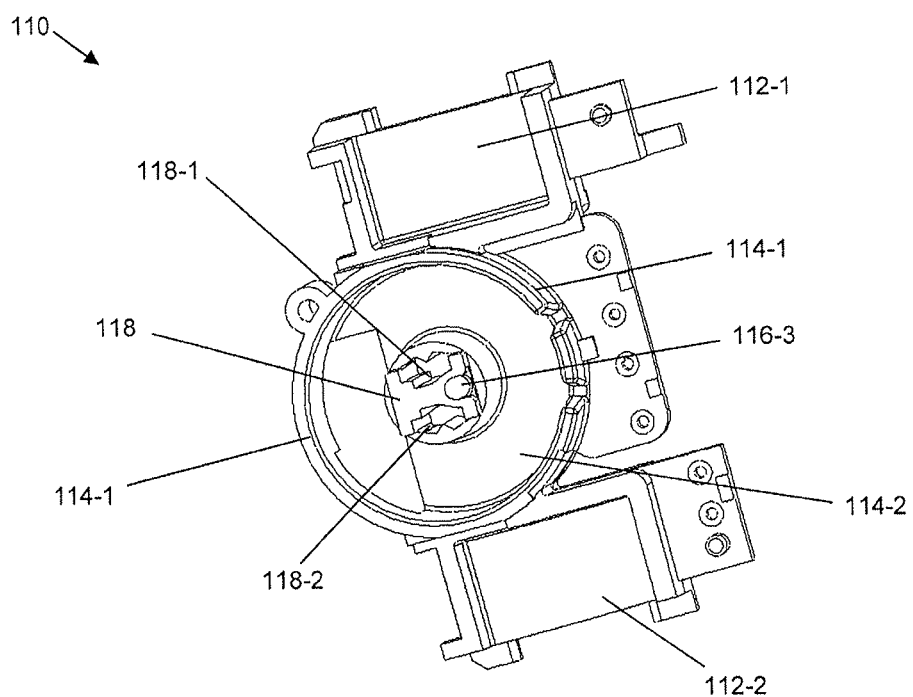

Referring to FIGS. 7A-7B, detail perspective views of dielectric housing 110 depicted in FIG. 6 is disclosed. FIG. 7A shows the top side of the dielectric housing 110. This view more clearly shows the toroid housing 114 and the terminal support wings 112-1, 112-2 described previously. The terminal support wings (112-1, 112-2) are configured to support the contact arms 104. The guide channel 116 is shown to include a central divider 116-4 that is configured to separate the line hot channel 116-1 from the line neutral channel 116-2. The central divider portion 116-4 also includes a narrower opening 116-3 for the test wire 106. A top view of the low voltage interface portion 111 is also shown in this view.

FIG. 7B shows the underside of the housing 110. The central cylindrical housing 114 includes a circular ring 114-1 that is configured to accommodate the PCB 101. The interface 118 protrudes above the bottom cylinder base 114-2 and the ring 114-1 such that it can be inserted into the PCB opening 101-2.

Figure 8:
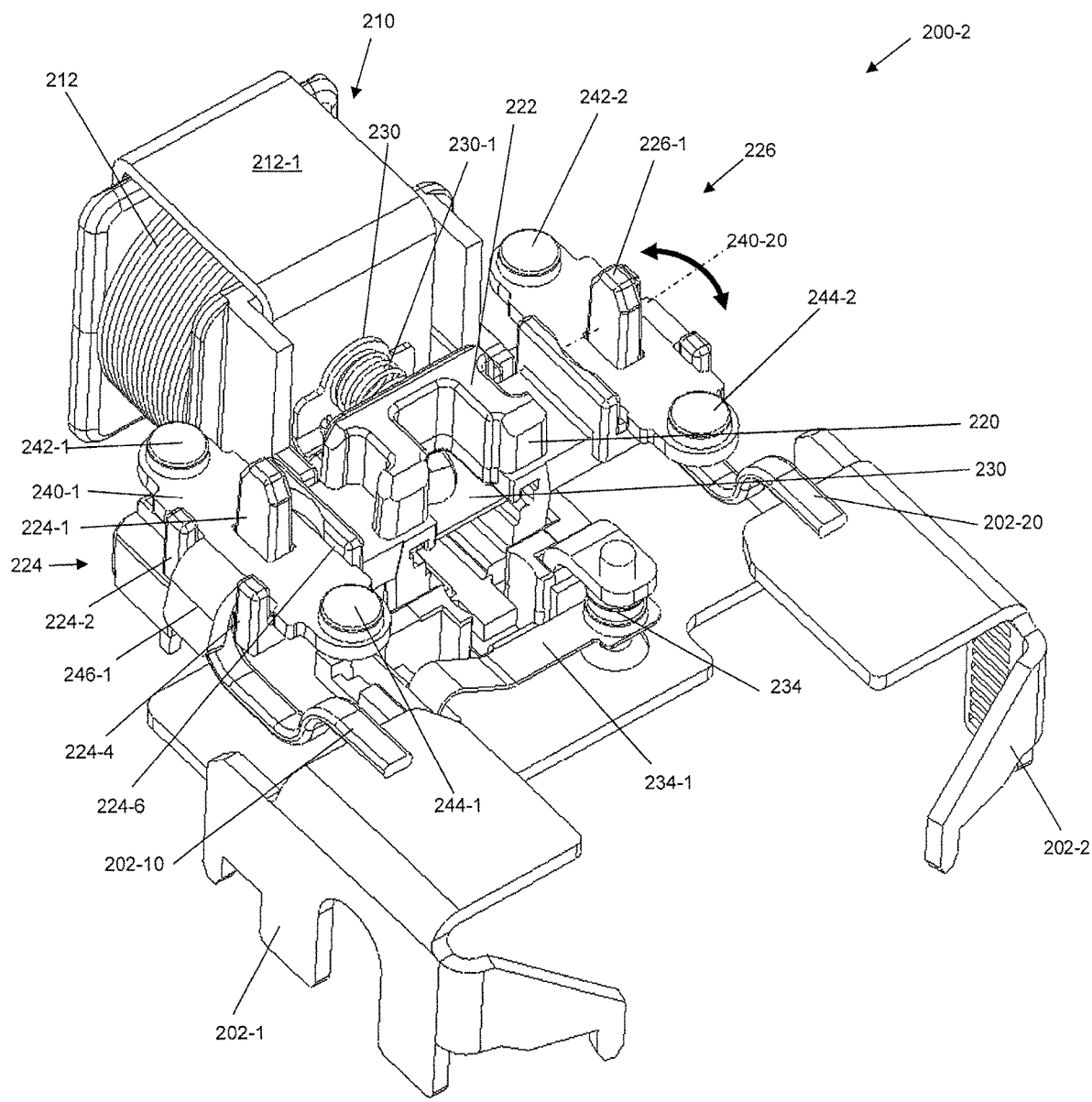
FIG. 8 is a perspective view of the electro-mechanical assembly depicted in FIG. 4.

As embodied herein and depicted in FIG. 8, a perspective view of the mechanical portion 200-2 of the electro-mechanical assembly 200 is disclosed. As shown above in FIGS. 2-4, the mechanical portion 200-2 is disposed on the PCB 201 (not shown in this view for clarity of illustration). The bobbin assembly 210 includes a solenoid coil 212 disposed within magnetic frame portion 210-1. As noted above, the bobbin assembly abuts the line interface housing 110 (not shown in this view) and functions as an armature stop for an armature plunger 214 (also not shown in this view).

The latch 230 and coil spring 230-1 are disposed between the solenoid assembly 210 and the latch block 220. The latch 230 includes a vertical strike plate portion that is engaged by the solenoid armature (not shown in this view) and a horizontal portion that is configured to move within the central portion 222 of the latch block 220.

The latch block 220 includes a hot bus bar carrier 224 and a neutral bus bar carrier 226 integrally formed and connected to a central latch block portion 222. The hot carrier 224 includes a central post 224-1 that is configured to accommodate a central opening in the hot bus bar 240-1 from underneath and a break spring (not shown) from over top. The hot carrier 224 also includes lateral posts 224-2 and 224-4 that are configured to engage the bus bar tab 246-1 therebetween. The bus bar 240-1 is also constrained by a raised retainer wall 224-6. (The neutral carrier 226 includes identical elements).

The hot bus bar 240-1 is electrically connected to the load hot terminal 202-1 by flexible cable 202-10. Likewise, the neutral bus bar 240-2 is electrically connected to the load hot terminal 202-2 by flexible cable 202-20. Each bus bar (240) includes contacts (242-1, 242-2) that are configured to mate with the line contacts (104-10, 10420) respectively, and contacts (244-1, 244-2) that are configured to mate with the receptacle contacts (22-12, 22-22) respectively.

As shown by arrow 240-20, the central post (226-1) and the lateral posts (226-2, 226-4) allow one side of the bus bar (240-2) to rotate upwardly when the opposite bus bar contact engages with its respective contact (104, or 22). Stated differently, if contact 242-2 engages line arm contact 104-20 first, the bus bar will pivot upwardly from contact 242-2 until contact 244-2 engages 22-22 (See, FIG. 3). If contact 244-2 engages contact 22-22, the opposite rotation occurs. At the same time, the bus bar tab (246-2) is disposed between the lateral posts (226-2, 226-4) that prevent the bus bar from moving laterally. Accordingly, the bus bar contacts are aligned in three dimensions in order to substantially minimize arcing and $I^2R$ losses.

The mechanical assembly 200-2 also includes an auxiliary switch 234 that includes switch throw blade 234-1. The auxiliary switch 234 is configured to substantially prevent the GFI circuit (on the electro-mechanical PCB 201) from receiving conditioned AC power (from the line interface PCB 101) when the device is tripped. The processor integrated circuit continues to receive conditioned power via a secondary power supply. See, FIG. 14.

Figure 9:
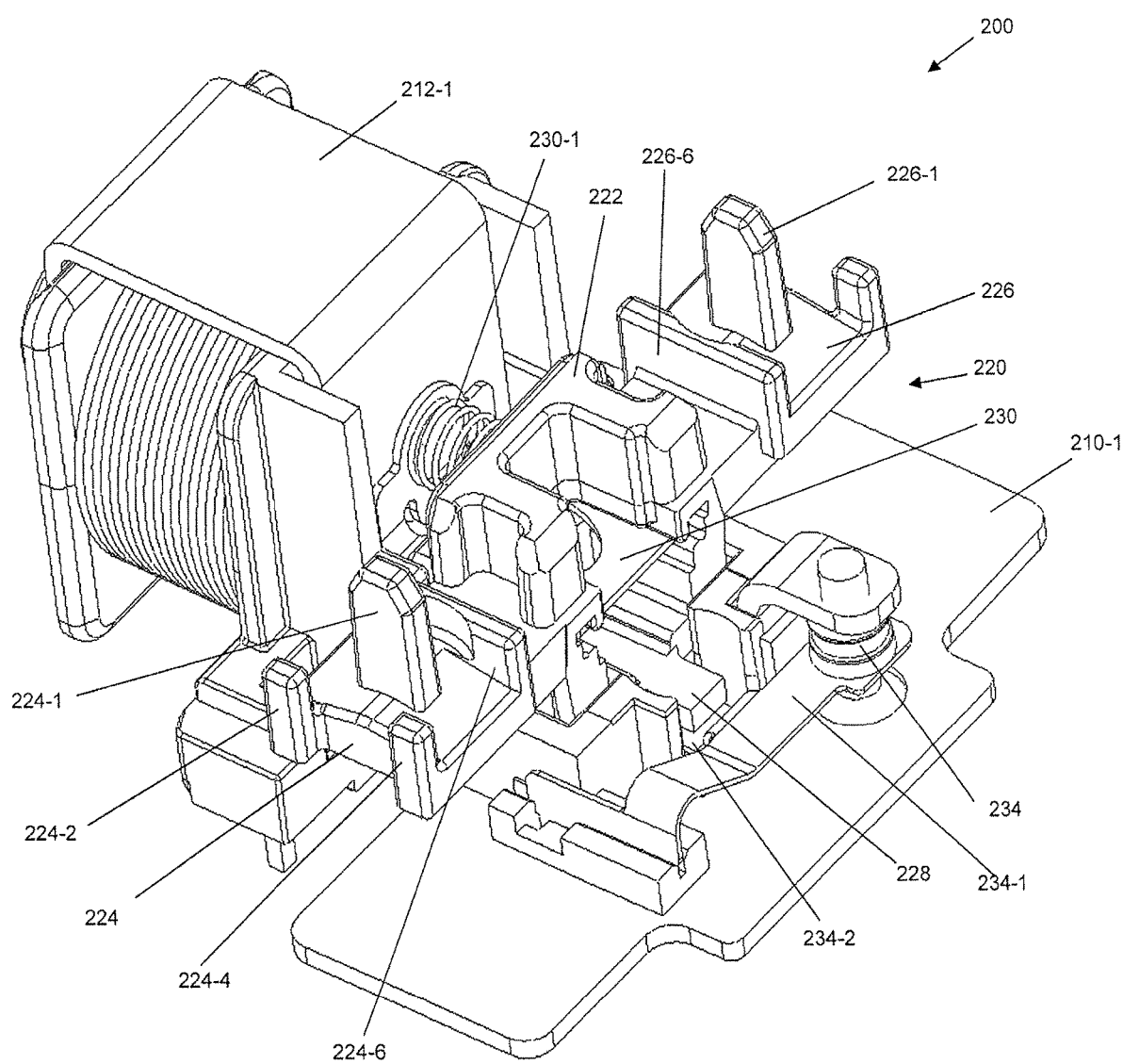
FIG. 9 is a perspective view of the circuit interrupter portion of the electro-mechanical assembly depicted in FIG. 8.

Referring to FIG. 9, a perspective view of the circuit interrupter portion 220 of the mechanical assembly depicted in FIG. 8 is shown. In this view, the bus bars (240-1, 240-2) are removed. Note that the bus bar retainer walls 224-6, 226-6 include circular recesses that are configured to accommodate a hot break spring and a neutral break spring, respectively. As noted above, the break springs (not shown) are inserted over the central posts (224-1, 226-1) and are configured to apply a break force to the bus bars when the latch 230 releases the reset pin 17-1 (not shown in this view) during a tripping action. The break force is stored in the break springs when the compressed between the separator and the bus bars in the reset state. The break force is released when the device is tripped. The spring force applied by the break springs, of course, is less than the make force applied by the make spring 17-2 coupled to the reset pin 17-1 (See, e.g., FIG. 13).

The latch block 220 also includes an auxiliary switch actuator portion 228 that is configured to engage a tab 234-2 that extends from the switch blade 234-1. When the reset pin 17-1 is released by the latch 230, the auxiliary latch block portion 228 engages tab 234-2 to force the auxiliary switch contacts 234 to open. When the reset pin engages the latch 230 and the make spring lifts the latch block 220 upwardly, the auxiliary switch tab 234-2 is pressed upwardly by an auxiliary switch coil spring 204 (not visible in this view) disposed underneath. The coil spring is seated in the back body 14 and extends through an aperture in the apron 210-1. See, e.g., FIG. 12. In an alternate embodiment of the present invention, the switch blade 234-1 may be pre-biased in the closed position as a redundant means for closing the auxiliary switch 234. In yet an alternate embodiment of the present invention, the switch blade 234-1 is pre-biased in the closed position and the auxiliary switch coil spring is omitted.

Figure 10:
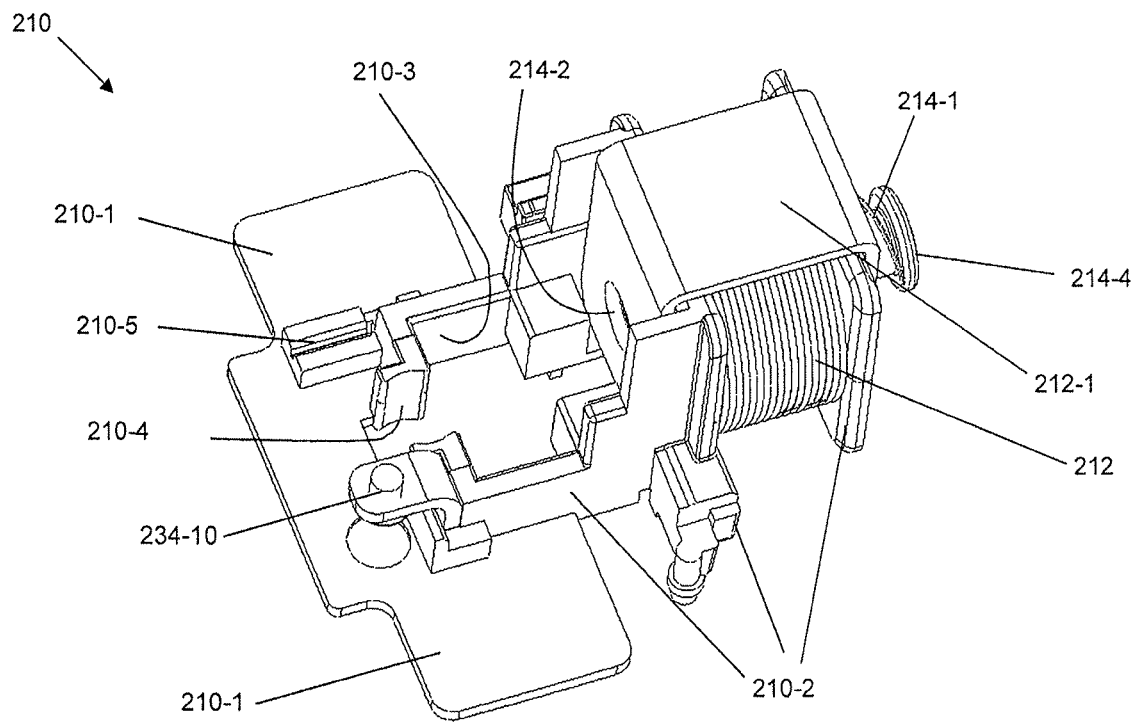
FIG. 10 is a perspective view of the solenoid actuator assembly depicted in FIG. 9.

Referring to FIG. 10, a perspective view of the solenoid actuator assembly 210 portion of the circuit interrupter depicted in FIG. 9 is disclosed. The solenoid assembly 210 includes a frame portion 210-2 that accommodates the solenoid bobbin 212 and the magnetic frame 212-1. In one embodiment of the invention, solenoid 212 includes a trip solenoid for normal usage and a second end-of-life (EOL) solenoid that is only used when the microprocessor 252 concludes that the device has reached EOL. The second solenoid may be disposed adjacent to the first solenoid with a dielectric material disposed therebetween. An armature plunger 214 is disposed within the solenoid 212 and is configured to be driven in an axial direction such that it emerges from the opening 214-2 to strike the latch 230 when the solenoid is energized. At the other end thereof, the head 214-4 of the armature pin 214 abuts a strike plate 114-3 disposed on the toroidal housing 114 (See, FIG. 5A, 7A). The head 214-4 normally abuts the strike plate due to the force applied by coil spring 214-6 captured between the head and the magnetic frame 212-1. Of course, when the solenoid is energized to trip the circuit interrupter, the magnetic force overcomes the spring force and the armature moves away from the strike plate.

Figure 11:
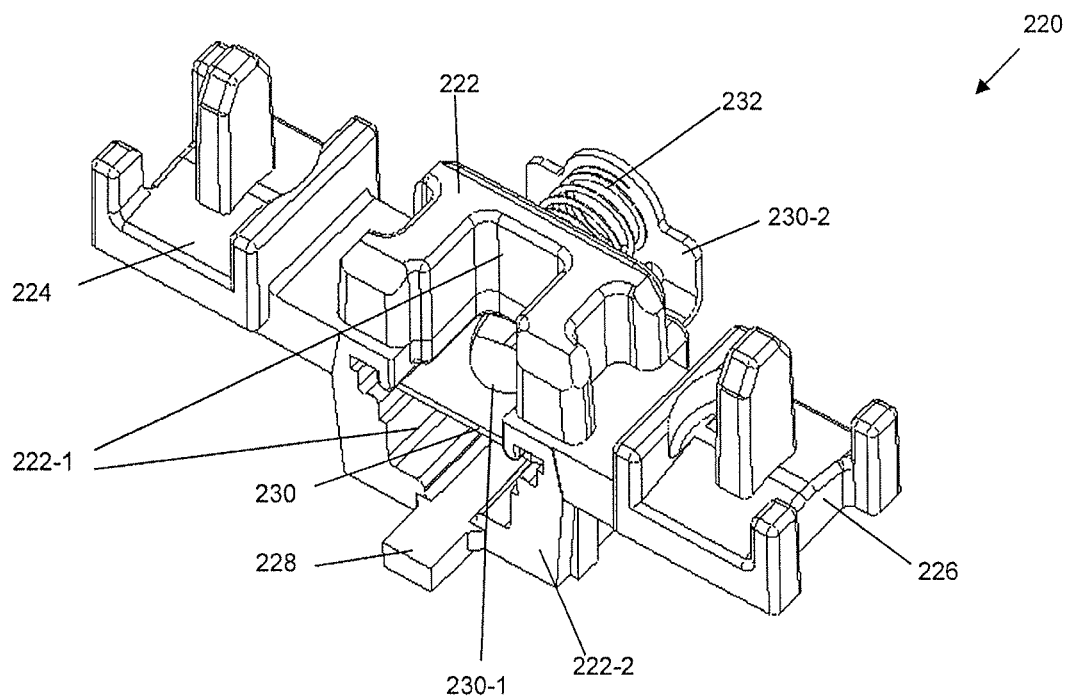
FIG. 11 is a perspective view of the latch block assembly depicted in FIG. 9.

The frame portion 210-2 also includes a raised wall 210-3 that defines an opening in the frame 210 that is configured to accommodate the lower center portion 222-2 of the latch block 220 (See, FIG. 11). The raised wall 212-3 includes an opening 210-4 opposite the armature opening 214-2; the opening is configured to accommodate the auxiliary coil spring 204 that resets the auxiliary switch blade 234-1 when the latch block is driven into the reset position. (See, FIG. 13). Switch slot 210-5 is configured to accommodate one end of the auxiliary switch blade 234-1. The frame portion 210-2 is integrally connected to an apron 210-1 that is disposed between the PCB 201 and the respective latch block carriers (224, 226). Thus, when the device is tripped, the carriers (224, 226) will rest on the apron 210-1.

Referring to FIG. 11, a perspective view of the latch block assembly 220 depicted in FIG. 9 is disclosed. As noted above, the lower center portion 222-2 of the latch block 220 is configured to be inserted within the raised wall 210-3 such that the auxiliary actuator 228 fits within the opening 210-4. The center latch block portion 222 is "pi-shaped" (π); the legs are spaced apart and form a central opening 222-1. As described below, a portion of the separator member 16 mates with the opening 222-1 to implement a two-piece reset pin guide channel. This design allows for a more compact latch block design in the z-direction, which in turn, provides for a smaller behind-the-strap device thickness, i.e., one that is less than one inch. The central latch block portion 222 also includes a horizontal slot that accommodates the latch 230. The latch 230 has a rather oblong opening 230-1 instead of the circular openings that are commonly employed in the art. The latch 230 also includes a strike plate 230-2 that is engaged by the armature 214 during a tripping action. Once the solenoid is deenergized, the armature 214 is withdrawn by its coil spring 214-1 allowing the latch coil spring 232 to drive the latch 230 back into the opening 222-1 until the strike plate 230-2 covers the armature opening 214-2 of the magnetic solenoid frame 212-1.

Figure 12:
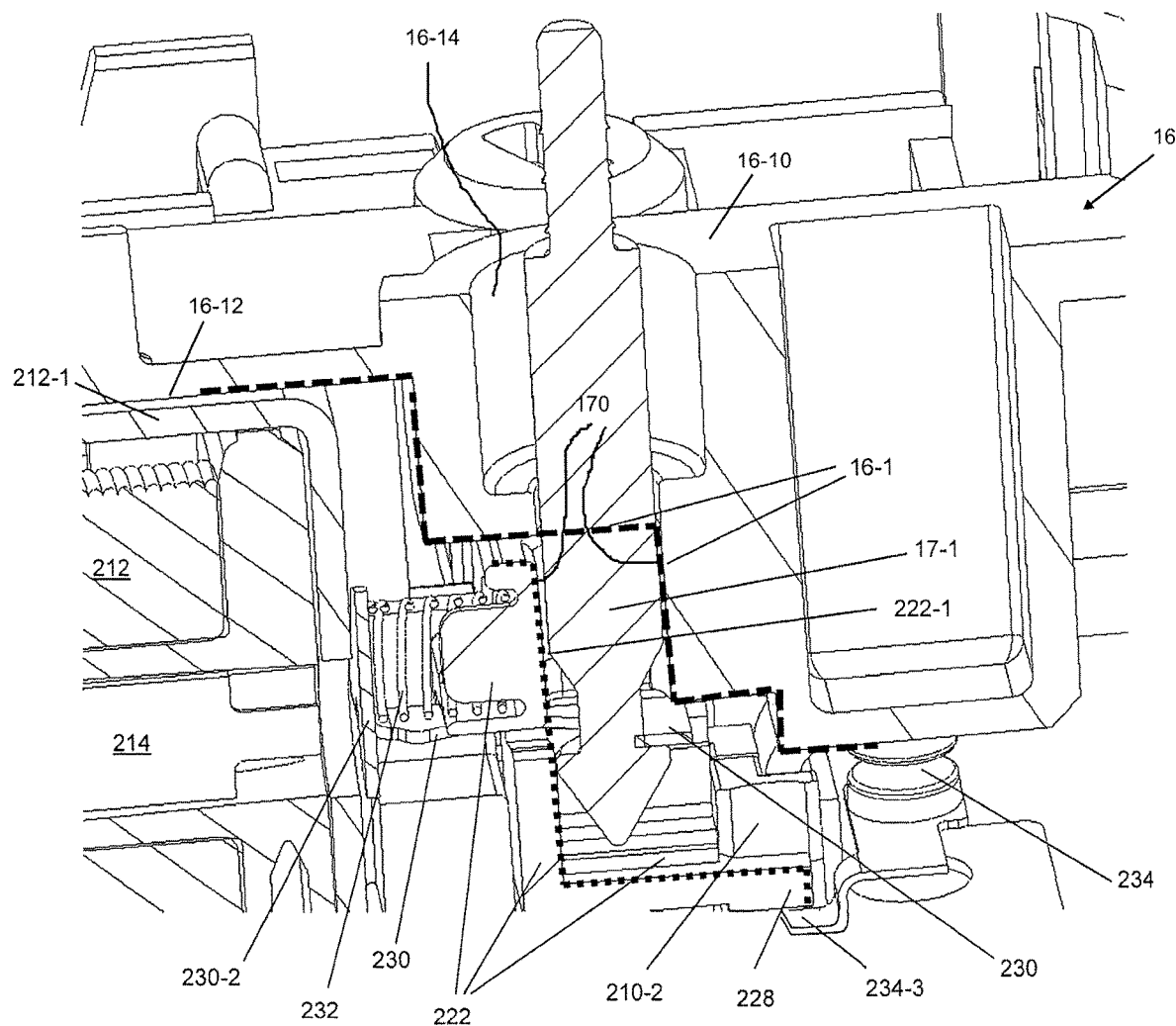
FIG. 12 is a detail cross-sectional view of the reset pin guide channel in accordance with an embodiment of the present invention.

Referring to FIG. 12, a detail cross-sectional view of the reset pin guide channel in accordance with an embodiment of the present invention is disclosed. The dashed line 16-1 represents an edge of the separator member 16 whereas the dotted line 222-1 represents the edge of the center latch block opening 222-1. The reset pin stem 17-1 is disposed within the guide channel formed by these two parts (i.e., between the dashed and dotted lines). This view also provides a clearer representation of the relationship between the auxiliary latch block actuator 228 and the auxiliary switch blade tab 234-3. Since the same reference numbers are used throughout the drawings to refer to the same or like parts, no further description is needed for the remaining parts depicted in this drawing.

Figure 13:
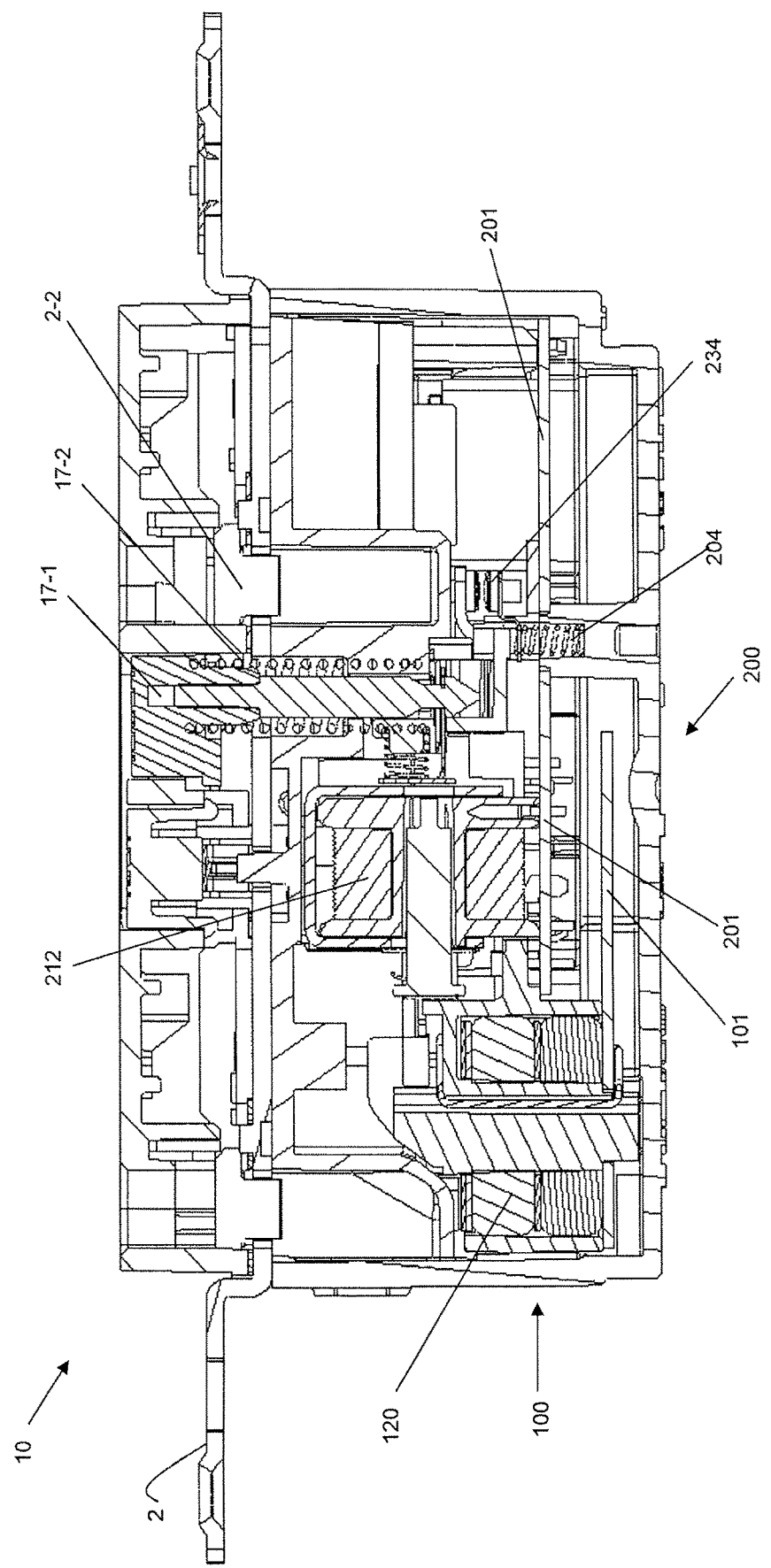
FIG. 13 is a cross-sectional view of a protective device in accordance with another embodiment of the present invention.

As embodied herein and depicted in FIG. 13, a cross-sectional view of a protective device in accordance with another embodiment of the present invention is disclosed. In the previous embodiment, the line interface PCB 101 was relatively small in size because it might only include a MOV and a half-wave rectifier power supply. In the discussion provided earlier, the present invention disclosed an interface PCB 101 that covered the entire interface housing 110. See, FIG. 7B. In this embodiment, however, the line interface PCB 101 is extended a great deal farther, i.e., under the electro-mechanical PCB 201 in order to accommodate more high-voltage conditioning components. As before, the two PCBs (101, 201) are discontinuous and offset such that surface tracking, cross-talk and/or surge currents from the PCB 101 cannot propagate to PCB 201.

Figure 14:
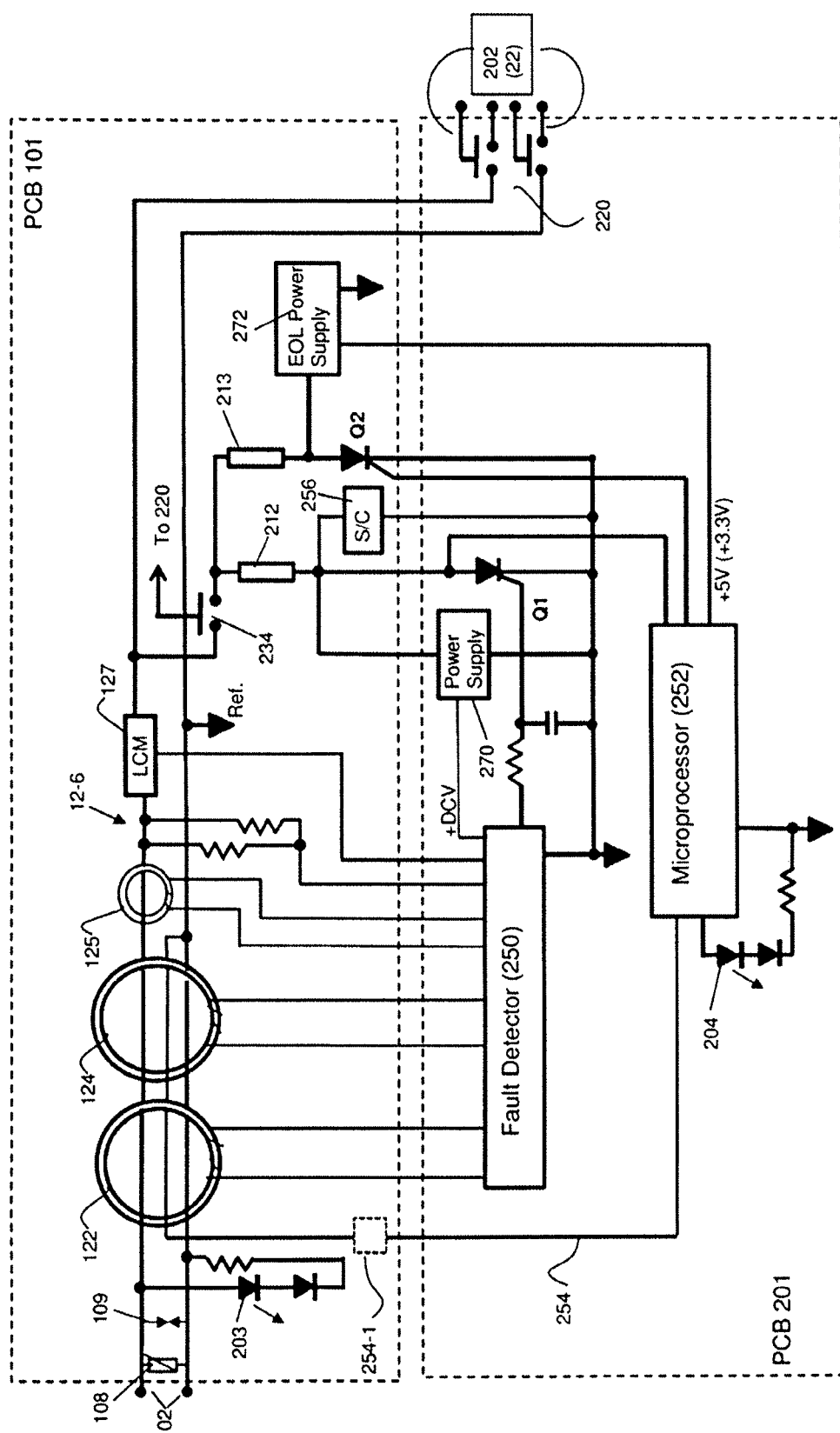
FIG. 14 is a schematic block diagram of the protective device in accordance with yet another embodiment of the present invention.

As embodied herein and depicted in FIG. 14, a schematic block diagram of the protective device is disclosed that may be implemented using the arrangement depicted in FIG. 13. Because this is a schematic representation, it shows the electrical connections but not necessarily the mechanical implementation. Thus, as before, the toroidal sensors 122, 124 are physically mounted on the line interface PCB 101, but are in reality, only connected to components disposed on PCB 201. In the dual-solenoid arrangement (212, 213), the solenoids are mounted on the low voltage board 201 (as shown above), but electrically connected to the high voltage AC line hot conductor 102-1. Thus, the solenoids are shown on the interface PCB 101 for clarity of illustration of the electrical interconnections.

The protective device 10 includes a differential transformer 122 which is configured to sense load-side ground faults, i.e. ground faults located in loads connected to load terminals (202) or receptacle contacts (22). Transformer 124 is configured as a grounded neutral transmitter that is configured for grounded-neutral fault detection. Both differential transformer 122 and grounded-neutral transformer 124 are coupled to the fault detector 250 by small signal interconnections between PCB 101 and PCB 201. Detector 250 receives power from a dual power supply circuit 270 that may be disposed on either PCB. The output of the detector 250 is connected to the control input of SCR Q1. When SCR Q1 is turned ON, the solenoid 212 is energized to actuate the circuit interrupter 220 such that the circuit interrupter 220 and the auxiliary switch 234 are tripped (opened). Solenoid 212 remains energized for a time period that is typically less than about 25 milliseconds. When the circuit interrupter 220 trips, the line terminals 102 are disconnected from their respective load terminals (202) or receptacle contacts (22). After the fault condition has been eliminated, the circuit interrupter 220 may be reset by way of a reset button 17 (See, e.g., FIGS. 1A-C).

The grounded neutral transmitter 124 is configured to detect a grounded neutral condition. (The line neutral conductor 2 is typically grounded in the electrical circuit at the panel—this does not constitute a grounded neutral fault condition). When a grounded neutral condition is not present, the grounded neutral transmitter 124 is configured to couple equal signals into the hot and neutral conductors. Because the differential transformer 122 is configured to sense a current differential, the equal signals provided by the grounded neutral transmitter 124 effectively cancel each other out. On the other hand, a grounded neutral condition does occur when the load neutral conductor (i.e., the conductor that is connected to the load neutral terminal or the neutral receptacle contact) is accidentally grounded. This creates a parallel conductive path (relative to the neutral return path) between the neutral line terminal and neutral load terminal. As a result, another signal circulates around this current loop and it is coupled onto the neutral conductor (but not the hot conductor) to create a differential current. The differential transformer 122 senses the differential current between the hot and neutral conductors and the detector 250 generates a fault detection signal to actuate SCR Q1, energize solenoid 212 and trip the circuit interrupter 220.

In one embodiment of the invention, device 10 is equipped with arc-fault protection and includes an arc-fault circuit interrupter (AFCI protection). AFCIs are configured to detect high frequency disturbances (indicative of arcing) superimposed on the power line frequency. The high frequency disturbances may occur in the load current, the line voltage, or both. Thus, the interface assembly 100 may include a toroidal load current sensor 125 and/or a voltage divider 126. In another embodiment, the interface assembly 100 may include a load current monitor (LCM) 127 featuring a shunt or a Hall Effect device. Since an arc fault condition may create a path between the hot conductor to ground, a differential sensor may be employed to sense this type of fault. As shown in FIG. 14, the current sensors (125, 127) and the voltage sensor 126 are coupled to the fault detector 250 so that the circuit interrupter can be tripped when an arc fault is detected. Reference is made to U.S. Pat. Nos. 6,362,628; 6,373,257; 6,538,863; and 6,876,528, which are is incorporated herein by reference as though fully set forth in its entirety, for a more detailed explanation of the current and voltage sensors and/or the arc fault detector. Based on the foregoing, those skilled in the art will appreciate that fault detector 250 may be configured to detect arc fault conditions, ground fault conditions, or both. In yet another embodiment of the invention a load current sensor module (LCM) 127 may be coupled to the load hot to measure the load current. LCM 127 may be implemented using a Hall Effect sensor or a resistive shunt.

After the fault signal is removed the circuit interrupter 220 may be manually reset by way of a reset button 17 (not shown). Auxiliary switch 234 opens when circuit interrupter 220 is in the tripped state and closes when the circuit interrupter is in the reset state.

In reference to the power supply circuit 270, it is provided to accommodate the needs of the detection function (described above). An independently operable end of life (EOL) power supply circuit 272 accommodates the needs of the universal auto-test function. Reference is made to U.S. patent application Ser. No. 13/834,636, which is incorporated herein by reference as though fully set forth in its entirety, for a more detailed explanation of a power supply 270 in accordance with one aspect of the present invention. When the device 10 detects a fault condition, it is configured to interrupt the circuit interrupter 220 during the positive half-cycle of the AC line cycle. In order to meet the trip time requirements, the second power supply portion of power supply 270 is configured to charge to the full supply voltage in less than about 2 milliseconds. This means that during the positive half cycles, a hazardous ground fault condition is detected and interrupted quickly.

The microprocessor 252 generates a simulated grounded neutral test signal by way of wire loop 254 when a FET is turned ON. When the FET is turned ON, the grounded neutral transmitter 124 produces an oscillating signal that is a function of the full power supply voltage. The ON state resistance of the FET is less than about 4 Ohms. Thus, the wire loop 254, in combination with the FET (in the ON state), form a loop that passes through the differential transformer 122 and neutral transmitter 124 to simulate a grounded neutral condition. One advantage for placing the third wire within the wire loop relates to improved noise immunity. When the third wire is employed, the wire loop 254 and the neutral conductor are isolated such that the current propagating in wire loop 254 during the self-test is not affected by voltage drops or electrical noise propagating in the neutral conductor. Noise propagating on the neutral conductor could otherwise impair the test fault signal and its detection by the GFCI.

The timing of the FET ON state is controlled by a timing resistor or by processor 252. (The FET and the timing resistor are depicted as circuit element 254-1 in FIG. 14). In one embodiment of the present invention, the FET is turned ON near the conclusion of the positive half cycle of the AC power source and remains ON through a portion of the negative half cycle to produce the test fault signal. The grounded neutral transformer 124 generates a differential current in response to the test current propagating in wire loop 254. The differential current is, in turn, sensed by transformer 122. If the circuit is working properly, the sensor signal provided by 122 should be deemed by detector 250 as a fault. Since the auto-test is performed during the negative half cycle or late in the positive half cycle such, SCR Q1 will not be turned ON and the device will not nuisance trip.

The power supply 270 is shown as being in series with the auxiliary switch 234 and the solenoid 212 on PCB 201. Note that power supply 270 may be included on PCB 201, along with other small signal voltage processing components, because the signal conditioner 256 (PCB 101) provides it with conditioned power signals. The signal conditioning circuit 256 includes a secondary MOV and other signal conditioning circuitry such as an RC filter circuit and/or an RLC filter circuit. When the auxiliary switch 234 is closed, the inductance of the solenoid 212 protects the power supply 270 from lightning surges that could otherwise damage the protective device (AFCI/GFCI). Thus, PCB 101 provides PCB 201 with a conditioned, i.e., protected, AC circuit. In other words, surface tracking, cross talk and surge voltages are substantially prevented from propagating from PCB 101 to PCB 201 by the PCB board discontinuities and offset, the large MOV 108 disposed between the line terminals 102, the solenoid 212, and the conditioning circuit 256. Those skilled in the art will also appreciate that another conditioning circuit may be employed with solenoid 213. It is not depicted herein for clarity of illustration. The auxiliary switch 234 is configured to protect the solenoid 212 should SCR Q1 short out by interrupting power to the low voltage PCB 201 when the circuit interrupter 220 trips. Likewise, the auxiliary switch 234 protects the other solenoid 213.

Thus, device 10 may include MOV 108 and two additional movistors disposed in the signal conditioning circuits 256. The movistors, of course, are configured to protect the GFCI from lighting surges. Since MOV 108 is disposed across-the-line it is relatively large (12 mm) in order to withstand surges. Since the movistors in the conditioning circuit 256 are disposed in series with the solenoid 212 and the self-test solenoid 213, respectively, they may be relatively smaller in size (e.g., 5-7 mm). The inductances of the dual solenoids 212, 213 serve as a high frequency filter that limits the surge energy that the conditioning circuit MOVs must absorb in the event of a lightning strike.

As described herein, the low voltage PCB 201 includes a microprocessor 252 disposed thereon. In one embodiment the microprocessor 252 may be implemented by a processor such as the Renesas R5F10266. The microprocessor 252 provides a 1 MHz clock signal that is used for digital clocks and other internal timing signals. The microprocessor 252 may include 2 kB ROM to store the firmware and 2 KB Flash memory to implement the wiring state register (for miswire detection).

It will be apparent to those of ordinary skill in the pertinent art that modifications and variations can be made to the processor 40 of the present invention depending on the degree of processing sophistication. The embedded processor 252 includes on-board memory that typically includes random access memory (RAM) and read only memory (ROM). The embedded processor 252 functions may be implemented using hardware, software, embedded processors, signal processors, RISC computers, application specific integrated circuits (ASICs), field programmable gate array (FPGA) devices, gate array state machines, customized integrated circuits and/or a combination thereof. The RAM memory may have battery back-up. Thus, the embodiments of the present invention are not limited to any specific combination of hardware circuitry and/or software. Taken together, RAM and ROM may be referred to herein as "computer-readable media." The term "computer-readable medium," as used herein, refers to any medium that participates in providing data and/or instructions to the processor for execution. For example, the computer-readable media employed herein may include any suitable memory device including SRAM, DRAM, NVRWM, PROM, E²PROM, Flash memory, or any suitable type of memory. The Flash memory or RAM with battery back-up are examples of non-volatile memory that is provided herein to store the wiring state of the device for multi-use miswire purposes.

One of the functions of the processor 252 is to orchestrate a two-step self-testing regimen. In the first step, processor 252 tests a portion of the protective circuit that includes sensors (122, 124, 125 or 127), fault detector 250, power supply 270, SCR Q1, and solenoid 212 by providing a simulated ground fault signal, a grounded neutral fault, or an arc fault to the sensor(s). The processor 252 monitors the anode of SCR Q1 in order to determine if the fault detection circuitry is operational. Because the SCR Q1 is actuated during a time frame when it cannot energize the solenoid, the device is prevented from tripping. This signal is registered by the processor 252 as a test acceptance signal, i.e., the protective device (AFCI/GFCI) is working properly. Every time the SCR anode goes low, an internal "end-of-life" timer in processor 252 is reset. The anode input is also coupled to a filter circuit that removes high frequency noise that might falsely indicate that the device 10 passed the end of life test. If the end-of-life timer is not reset within the preprogrammed time frame, it signals the CPU in processor 252 that and end-of-life condition has been reached. The CPU causes LED 204 to be illuminated and further causes SCR Q2 to trip the circuit interrupter 220 after a predetermined time period has elapsed.

In the second step of the self-testing regimen, a test signal is applied by processor 252 to the gate of the SCR to test the operability of the SCR and the solenoid. As in the first step, the test signal is timed so that the response signal does not cause circuit interrupter 220 to nuisance trip. By way of illustration, the response signal may occur late in a half cycle where the line voltage is too low to cause tripping, or during the negative half cycles of the line voltage when the protective circuit is configured to trip only during the positive half cycles.

In the dual-solenoid arrangement depicted in FIG. 14, a failed self-test results in the circuit interrupter being tripped by redundant solenoid 213. In a single solenoid embodiment of the present invention, solenoid 213 is omitted and SCR Q2 is connected to trip the circuit interrupter 220 by way of solenoid 212. In another single solenoid embodiment, both solenoid 213 and SCR Q2 are omitted and processor 250 is configured to trip the interrupter by way of SCR Q1. Reference is made to U.S. Pat. No. 6,421,214, which is incorporated herein by reference as though fully set forth in its entirety, for a more detailed explanation of an end of life detection circuit in accordance with yet another embodiment of the present invention.

The indicator 204 is shown as a visual indicator (LED), but those skilled in the art will appreciate that it may be implemented as an audible indicator or as both an audible and visual indicator. In alternate embodiment, after an end of life condition is detected, the indicator 204 may provide a cyclical or oscillating indication to alert the user that power denial is imminent. After a predetermined interval, the power denial is implemented to trip the device. Once tripped, the device cannot be reset. In another embodiment the device can be reset, however, it will trip again after another predetermined interval. FIG. 14 depicts a pilot indicator light 203 that is configured to emit illumination when voltage is provided to line terminals 102. The pilot indicator is fed by unconditioned power and is thus disposed on the interface PCB 101.

As shown, the processor 252 is coupled to a redundant processor power supply 272 that derives power from the line side of the interrupting contacts instead of indirectly through auxiliary switch 234. The redundant processor power supply 272 allows the self-test circuit to operate if there is an end of life condition in the power supply 270. Moreover, note that GFCI power supply 270 is deenergized in the tripped state, but since the processor 252 has its own power supply 272, it is functional in the tripped state.

The present invention provides miswiring protection capabilities. Only one bit of non-volatile memory is required for this function although the system memory may include more. The one-bit memory, i.e., the wiring state register, is used to store the wiring state of the device. (1=proper wiring, 0=miswiring). Thus, when the wiring state register stores a ONE (1), the processor 252 allows the circuit interrupter 222 to be reset (assuming that an end-of-life state is not extant). However, if the wiring state register is LOW, it indicates a miswired condition and the circuit interrupter 222 cannot remain reset because the processor will keep tripping the interrupter until the proper wiring is achieved and the memory bit is set to a HIGH state. As described above, the wiring state register is implemented using flash memory in one embodiment of the invention.

While the device is being manufactured, one of the final assembly steps before the device enters the stream of commerce is to write a logic zero into the wiring state register. Reference is made to U.S. patent application Ser. No. 13/834,636, which is incorporated herein by reference as though fully set forth in its entirety, for a more detailed explanation of the wiring state detection register and procedure. The present invention uses an integrated approach to protecting low signal voltage devices such as fault detectors, microprocessors, and the like from damage from surface-tracking, cross-talk, and surge voltages. For example, the two PCBs (101, 201) are discontinuous and offset about 0.25 inches. Moreover, the line interface PCB 101 includes several layers of protective circuitry that provide PCB 201 conditioned power signals. In other words, surface tracking, cross talk and surge voltages are substantially prevented from propagating from PCB 101 to PCB 201 by the PCB board discontinuities and offset, and the protective conditioning circuitry described herein. While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring device comprising:
a housing assembly including a cover assembly and a back body member, the cover assembly including a front cover, the front cover having a plurality of receptacle openings, the housing assembly further including a plurality of line terminals and a plurality of feed-through load terminals, the housing assembly also including a plurality of receptacle load terminals substantially aligned with the plurality of receptacle openings;
a fault protection circuit disposed inside the housing, having sensing components mounted to one side of a first PCB, wherein the sensing components include a differential transformer, grounded neutral transformer and current sensor stacked on top each other, the fault protection circuit being configured to provide a fault detection signal in response to detecting at least one type of predetermined fault condition;
a circuit interrupter disposed inside the housing, the circuit interrupter being configured to couple the plurality of line terminals, the plurality of feed-through load terminals and the plurality of receptacle load terminals in a first state in response to a reset stimulus being applied to a reset button, the circuit interrupter being configured to decouple the plurality of line terminals, the plurality of feed-through load terminals and the plurality of receptacle load terminals in a second state when the latching element and a reset pin are decoupled in response to the fault detection signal; and
an indication circuit having an indicator to alert the user of device status.

2. The device of claim 1, wherein cover assembly further includes a separator portion.

3. The device of claim 2, wherein the front cover includes at least one interface button opening.

4. The device of claim 3, further comprising a latch block assembly including a central latch block portion configured to accommodate a reset pin and a latching element, the central latch block portion including an opening, the reset assembly guide portion substantially preventing the reset pin from escaping the central latch block portion via the opening, a distal end of the reset pin being positioned distally to a distal end of the latching element when in a reset position.

5. The device of claim 3, wherein the at least one interface button opening is configured to accommodate the reset button, the reset button being attached to the reset pin.

6. The device of claim 4, wherein the reset assembly guide portion is disposed on a major surface of the separator portion facing the back body member and is configured to accommodate the opening of the latch block assembly.

7. The device of claim 1, wherein the current sensor may be a current transformer, Hall Effect sensor or a resistive shunt.

8. The device of claim 1 wherein part of the fault detection circuit is mounted on the first PCB and part of the fault detection circuit is mounted on a second PCB.

9. The device of claim 8, wherein the first PCB accommodates sensors and the second PCB accommodates remaining electronics.

10. The device of claim 1, wherein the indication circuit comprises an LED with a flashing pattern to indicate device status.

11. The device of claim 1, wherein the indication circuit uses an audible signal with sound pattern to indicate device status.

12. The device of claim 1, wherein the indication circuit indicates using an audio signal or an audible signal.

13. The device of claim 1, wherein the indication circuit is configured to deliver an indication messages through either visual or audible paths.

14. The device of claim 13, wherein certain indication messages may be delivered through visual paths while others are delivered through audible paths.

15. The device of claim 1, wherein the device status includes one or more of the following: type of fault, if unit is on/off, pass/fail of manual test, pass/fail of self-test, end of life, and miswire.

16. The device of claim 1, wherein the indicator prompts the user to manually test the device.

17. The device of claim 1, wherein the cover assembly further includes a reset pin aperture and a reset guide portion.

18. An electrical wiring device comprising:
a housing assembly including a cover assembly and a back body member, the cover assembly including a front cover, the front cover having a plurality of receptacle openings, the housing assembly further including a plurality of line terminals and a plurality of feed-through load terminals, the housing assembly also including a plurality of receptacle load terminals substantially aligned with the plurality of receptacle openings;
a fault protection circuit disposed inside the housing, having sensing components mounted to one side of a first PCB, wherein the sensing components include a differential transformer, grounded neutral transformer and current sensor stacked on top each other, the fault protection circuit being configured to provide a fault detection signal in response to detecting at least one type of predetermined fault condition;
a circuit interrupter disposed inside the housing, the circuit interrupter being configured to couple the plurality of line terminals, the plurality of feed-through load terminals and the plurality of receptacle load terminals in a first state in response to a reset stimulus being applied to a reset button, the circuit interrupter being configured to decouple the plurality of line terminals, the plurality of feed-through load terminals and the plurality of receptacle load terminals in a second state when the latching element and a reset pin are decoupled in response to the fault detection signal; and
an indication circuit having an indicator to alert the user to manually test the device.

19. The device of claim 18 wherein the indicator prompts the user to manually test the device after a predetermined time period.

20. The device of claim 18 wherein the indicator prompts the user to manually test the device after a predetermined time period if a manual test has not been performed within the predetermined time period.

21. The device of claim 18 wherein the indicator prompts user to manually test the device after a predetermined time period of one year if a manual test has not been performed within the predetermined time period.

22. The device of claim 18, wherein cover assembly further includes a separator portion.

23. The device of claim 22, wherein the front cover includes at least one interface button opening.

24. The device of claim 23, further comprising a latch block assembly including a central latch block portion configured to accommodate a reset pin and a latching element, the central latch block portion including an opening, the reset assembly guide portion substantially preventing the reset pin from escaping the central latch block portion via the opening, a distal end of the reset pin being positioned distally to a distal end of the latching element when in a reset position.

25. The device of claim 24, wherein the at least one interface button opening is configured to accommodate the reset button, the reset button being attached to the reset pin.

26. The device of claim 25, wherein the reset assembly guide portion is disposed on a major surface of the separator portion facing the back body member and is configured to accommodate the opening of the latch block assembly.

27. The device of claim 18, wherein the current sensor may be a current transformer, Hall Effect sensor or a resistive shunt.

28. The device of claim 18 wherein part of the fault detection circuit is mounted on the first PCB and part of the fault detection circuit is mounted on a second PCB.

29. The device of claim 28, wherein the first PCB accommodates sensors and the second PCB accommodates remaining electronics.

30. The device of claim 18, wherein the indication circuit comprises an LED with a flashing pattern to indicate device status.

31. The device of claim 18, wherein the indication circuit uses an audible signal with sound pattern to indicate device status.

32. The device of claim 18, wherein the indication circuit indicates using an audio signal or an audible signal.

33. The device of claim 18, wherein the indication circuit is configured to deliver an indication messages through either visual or audible paths.

34. The device of claim 33, wherein certain indication messages may be delivered through visual paths while others are delivered through audible paths.

35. The device of claim 18, wherein the device status includes one or more of the following: type of fault, if unit is on/off, pass/fail of manual test, pass/fail of self-test, end of life, and miswire.

36. The device of claim 18, wherein the cover assembly further includes a reset pin aperture and a reset guide portion.

37. The device of claim 18 wherein the indicator prompts user to manually test the device after a predetermined time period of greater than one year if a manual test has not been performed within the predetermined time period.

38. The device of claim 18 wherein the indicator prompts user to manually test the device after a predetermined time period of less than one year if a manual test has not been performed within the predetermined time period.

\* \* \* \* \*